United States Patent
Kim et al.

(10) Patent No.: US 11,594,443 B2
(45) Date of Patent: Feb. 28, 2023

(54) SUBSTRATE BONDING APPARATUS AND METHOD OF MANUFACTURING SEMICONDUCTOR DEVICE BY USING THE SUBSTRATE BONDING APPARATUS

(71) Applicant: Samsung Electronics Co., Ltd., Suwon-si (KR)

(72) Inventors: Hoechul Kim, Seoul (KR); Taeyeong Kim, Yongin-si (KR); Hakjun Lee, Hwaseong-si (KR); Hoonjoo Na, Seoul (KR)

(73) Assignee: Samsung Electronics Co., Ltd.

( * ) Notice: Subject to any disclaimer, the term of this patent is extended or adjusted under 35 U.S.C. 154(b) by 271 days.

(21) Appl. No.: 16/892,492

(22) Filed: Jun. 4, 2020

(65) Prior Publication Data
US 2021/0057263 A1    Feb. 25, 2021

(30) Foreign Application Priority Data
Aug. 22, 2019  (KR) .......................... 10-2019-0103312

(51) Int. Cl.
*H01L 21/683* (2006.01)
*H01L 21/50* (2006.01)
(Continued)

(52) U.S. Cl.
CPC .......... *H01L 21/6838* (2013.01); *H01L 21/50* (2013.01); *H01L 24/94* (2013.01); *H01L 21/603* (2021.08)

(58) Field of Classification Search
CPC ............... Y10T 156/10; H01L 2224/94; H01L 2224/80948; H01L 2224/80895; H01L 2224/80896; H01L 2224/80357; H01L 2224/80013; H01L 2224/8001; H01L 2224/75745; H01L 2224/75744; H01L 2224/75314; H01L 2224/75304; H01L 2224/75305; H01L 2224/08145; H01L 21/6838; H01L 21/50; H01L 21/603;
(Continued)

(56) References Cited

U.S. PATENT DOCUMENTS 6,383,890 B2 * 5/2002 Takisawa .......... H01L 21/67092
                                                            438/455
7,612,895 B2   11/2009 Gabriel et al.
(Continued)

FOREIGN PATENT DOCUMENTS

EP    675 165    *  6/2006  ............. H01L 24/26
JP    2017-118066 *  6/2017  ............. H01L 21/02
(Continued)

*Primary Examiner* — Mary A Wilczewski
(74) *Attorney, Agent, or Firm* — Myers Bigel, P.A.

(57) ABSTRACT

A substrate bonding apparatus includes a first bonding chuck configured to support a first substrate and a second bonding chuck configured to support a second substrate such that the second substrate faces the first substrate. The first bonding chuck includes a first base, a first deformable plate on the first base and configured to support the first substrate and configured to be deformed such that a distance between the first base and the first deformable plate is varied, and a first piezoelectric sheet on the first deformable plate and configured to be deformed in response to power applied thereto to deform the first deformable plate.

19 Claims, 18 Drawing Sheets

(51) Int. Cl.
   *H01L 23/00*   (2006.01)
   *H01L 21/603*  (2006.01)

(58) Field of Classification Search
   CPC ......... H01L 21/67092; H01L 21/68735; H01L
         21/67011; H01L 21/167; H01L 21/67121;
         H01L 21/185; H01L 21/67017; H01L
         21/67259; H01L 21/67276; H01L 21/68;
         H01L 24/74; H01L 24/80; H01L 24/94
   See application file for complete search history.

(56) References Cited

U.S. PATENT DOCUMENTS

| | | | |
|---|---|---|---|
| 9,741,596 B2 | 8/2017 | Hayashi et al. | |
| 9,754,813 B2 | 9/2017 | Huang et al. | |
| 2015/0214082 A1* | 7/2015 | Huang | H01L 21/76251 |
| | | | 438/457 |
| 2015/0357226 A1* | 12/2015 | Liu | B23B 31/305 |
| | | | 438/457 |
| 2016/0009070 A1* | 1/2016 | Hayashi | B32B 41/00 |
| | | | 156/367 |
| 2017/0082918 A1 | 3/2017 | Kugimiya | |
| 2017/0221856 A1 | 8/2017 | Yamauchi | |
| 2018/0047699 A1 | 2/2018 | Omori et al. | |
| 2018/0370210 A1* | 12/2018 | Kim | H01L 24/80 |
| 2019/0043826 A1 | 2/2019 | Sugaya et al. | |
| 2019/0148333 A1 | 5/2019 | Chen et al. | |
| 2020/0020553 A1* | 1/2020 | Otsuka | H01L 21/67092 |
| 2021/0057263 A1* | 2/2021 | Kim | H01L 21/67092 |
| 2021/0104405 A1* | 4/2021 | Kim | H01L 21/67259 |
| 2021/0143026 A1* | 5/2021 | Jeon | H01L 21/67092 |
| 2021/0272836 A1* | 9/2021 | Sugakawa | H01L 21/67092 |

FOREIGN PATENT DOCUMENTS

| | | | | |
|---|---|---|---|---|
| KR | 10-2015-0136848 | * | 12/2015 | H01L 23/75 |
| WO | WO 2017/155002 | * | 9/2017 | H01L 21/02 |

* cited by examiner

SUBSTRATE BONDING APPARATUS AND METHOD OF MANUFACTURING SEMICONDUCTOR DEVICE BY USING THE SUBSTRATE BONDING APPARATUS

CROSS-REFERENCE TO RELATED APPLICATION

This application claims the benefit of Korean Patent Application No. 10-2019-0103312, filed on Aug. 22, 2019, in the Korean Intellectual Property Office, the disclosure of which is incorporated by reference herein in its entirety.

BACKGROUND

The inventive concept relates to a substrate bonding apparatus and a method of manufacturing a semiconductor device by using the substrate bonding apparatus.

In a process of manufacturing a semiconductor device, a substrate bonding process of bonding two or more substrates may be performed. The substrate bonding process may be performed by enhancing a mounting density of semiconductor chips in a semiconductor device. For example, a semiconductor module having a structure where semiconductor chips are stacked may be used to enhance a mounting density of semiconductor chips, shorten a wiring length between semiconductor chips, and facilitate high-speed signal processing. In a case of manufacturing a semiconductor module having a stacked semiconductor chip structure, bonding may be performed in wafer level rather than in chip level, and then, a bonded wafer may be cut in plurality of stacked semiconductor chips, thereby enhancing productivity. The substrate bonding process may be performed as a wafer-to-wafer process of directly bonding two wafers without a adhesive medium. The wafer-to-wafer process may be performed by using a bonding apparatus including a bonding chuck for supporting wafers and an element for pressurizing the wafers.

SUMMARY

The inventive concept provides a substrate bonding apparatus and a method of manufacturing a semiconductor device by using the substrate bonding apparatus.

According to an aspect of the inventive concept, there is provided a substrate bonding apparatus including a first bonding chuck configured to support a first substrate, the first bonding chuck including a first base, a first deformable plate on the first base and configured to support the first substrate, the first deformable plate configured to be deformed such that a distance between the first base and the first deformable plate is varied, and a first piezoelectric sheet on the first deformable plate and configured to be deformed in response to power applied thereto to deform the first deformable plate, and a second bonding chuck configured to support a second substrate such that the second substrate faces the first substrate.

According to another aspect of the inventive concept, there is provided a substrate bonding apparatus including a first bonding chuck including a first deformable plate deformed to deform a first substrate while supporting the first substrate and a plurality of first displacement sensors configured to sense displacements of different portions of the first deformable plate, a second bonding chuck configured to support a second substrate such that the second substrate faces the first substrate, and a controller configured to control deformation of the first deformable plate, wherein the first bonding chuck is configured to primarily deform the first deformable plate to have a convex shape relative to the second bonding chuck, and the controller is configured to generate a feedback deformation control signal for secondarily deforming the first deformable plate on the basis of displacements of the primarily-deformed first deformable plate sensed by the plurality of first displacement sensors.

According to another aspect of the inventive concept, there is provided a substrate bonding apparatus including a first bonding chuck including a first deformable plate configured to deform a first substrate while supporting the first substrate and a plurality of first displacement sensors configured to sense displacements of different portions of the first deformable plate, a second bonding chuck including a second deformable plate configured to deform a second substrate while supporting the second substrate and a plurality of second displacement sensors configured to sense displacements of different portions of the second deformable plate, the second bonding chuck above the first bonding chuck, and a controller configured to control deformation of the first deformable plate and deformation of the second deformable plate, wherein the first bonding chuck is configured to primarily deform the first deformable plate to have an upward convex shape, the second bonding chuck is configured to primarily deform the second deformable plate to have a downward convex shape, and the controller is configured to generate a feedback deformation control signal for secondarily deforming each of the first deformable plate and the second deformable plate on the basis of displacements of the primarily-deformed first deformable plate sensed by the plurality of first displacement sensors and displacements of the primarily-deformed second deformable plate sensed by the plurality of second displacement sensors.

According to another aspect of the inventive concept, there is provided a method of manufacturing a semiconductor device, the method including aligning a second bonding chuck, on which a second substrate is disposed, and a first bonding chuck including a first deformable plate supporting a first substrate, primarily deforming the first deformable plate to primarily deform the first substrate, sensing displacements of different portions of the primarily-deformed first deformable plate by using a plurality of first displacement sensors, secondarily deforming the first deformable plate to secondarily deform the first substrate on the basis of the displacements of the primarily-deformed first deformable plate sensed by the plurality of first displacement sensors, and bonding the second substrate to the secondarily-deformed first substrate.

BRIEF DESCRIPTION OF THE DRAWINGS

Embodiments of the inventive concept will be more clearly understood from the following detailed description taken in conjunction with the accompanying drawings in which.

DETAILED DESCRIPTION

Hereinafter, embodiments will be described in detail with reference to the accompanying drawings. Like numeral references refer to like elements, and their repetitive descriptions may be omitted in the interest of brevity.

Figure 1:
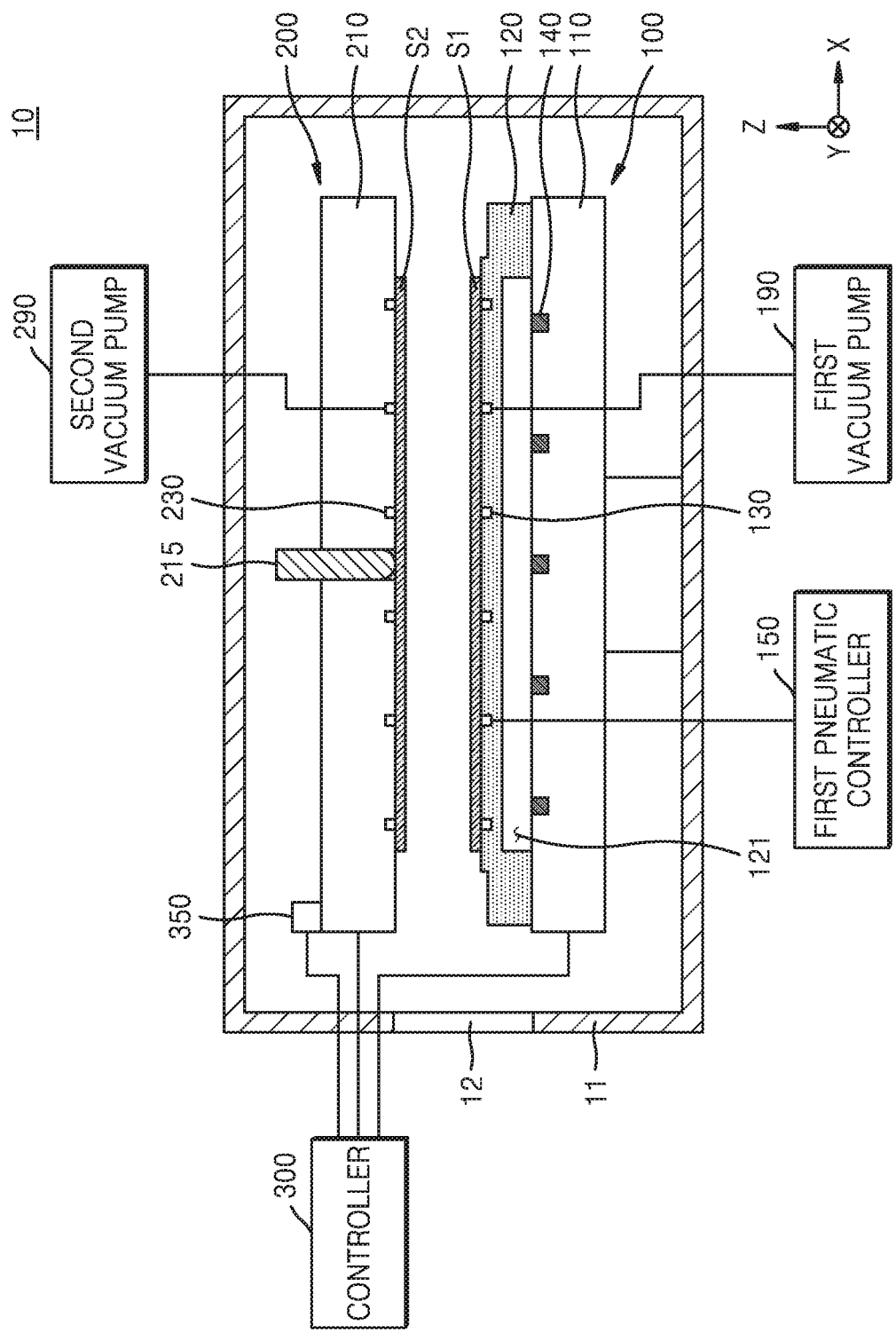
FIG. 1 is a cross-sectional view illustrating a substrate bonding apparatus according to embodiments.

FIG. 1 is a cross-sectional view illustrating a substrate bonding apparatus 10 according to embodiments.

Referring to FIG. 1, the substrate bonding apparatus 10 may include a first bonding chuck 100, a second bonding chuck 200, a controller 300, and a chamber 11 which accommodates the first bonding chuck 100 and the second bonding chuck 200.

The first bonding chuck 100 may support a first substrate S1. In embodiments, the first bonding chuck 100 may be configured to hold (or secure) the first substrate S1 by using vacuum pressure. For example, the first bonding chuck 100 may include a first vacuum pump 190. The first vacuum pump 190 may provide apply a vacuum pressure in a first vacuum groove 130 provided at a portion of the first bonding chuck 100 where the first substrate S1 is placed. When vacuum pressure is generated in the first vacuum groove 130 by the first vacuum pump 190, the first substrate S1 may be vacuum-adsorbed or held by the vacuum pressure onto the first bonding chuck 100. Alternatively, in other embodiments, the first bonding chuck 100 may be configured to support the first substrate S1 with an electrostatic force. When the first bonding chuck 100 is configured to support the first substrate S1 with an electrostatic force, the first bonding chuck 100 may include an electrode which is supplied with power to generate an electrostatic force for holding the first substrate S1.

The second bonding chuck 200 may be disposed opposite to the first bonding chuck 100 and may support a second substrate S2. In embodiments, the second bonding chuck 200 may be configured to hold (or secure) the second substrate S2 by using vacuum pressure. For example, the second bonding chuck 200 may include a second vacuum pump 290. The second vacuum pump 290 may provide apply a vacuum pressure in a second vacuum groove 230 provided at a portion of the second bonding chuck 200 where the second substrate S2 is placed. When vacuum pressure is generated in a second vacuum groove 230 by the second vacuum pump 290, the second substrate S2 may be vacuum-adsorbed or held by the vacuum pressure onto the second bonding chuck 200. Alternatively, in other embodiments, the second bonding chuck 200 may be configured to support the second substrate S2 with an electrostatic force.

In this case, the first bonding chuck 100 may be a lower bonding chuck, and the second bonding chuck 200 may be an upper bonding chuck arranged over or above the first bonding chuck 100. However, the present embodiment is not limited thereto, and the second bonding chuck 200 may be a lower bonding chuck, and the first bonding chuck 100 may be an upper bonding chuck arranged over or above the second bonding chuck 200.

In embodiments, the first bonding chuck 100 may include a first base 110, a first deformable plate 120 disposed on the first base 110, the first vacuum pump 190, a first pneumatic controller 150, and a plurality of first displacement sensors 140.

The first deformable plate 120 may include the first vacuum groove 130 where vacuum pressure is generated. The first vacuum pump 190 may apply vacuum pressure to the first vacuum groove 130 so that the first substrate S1 is vacuum-adsorbed onto one surface of the first deformable plate 120, or may release the vacuum pressure of the first vacuum groove 130 so that vacuum-adsorption or vacuum adherence of the first substrate S1 is released. The first vacuum groove 130 may include a plurality of vacuum grooves disposed between a center and an outer circumference or outer portion of the first deformable plate 120, and the first vacuum pump 190 may be configured to individually control vacuum pressure provided in each of the plurality of vacuum grooves.

The first deformable plate 120 may be disposed on the first base 110. The first deformable plate 120 may be deformed such that a distance between the first base 110 and the first deformable plate 120 varies. For example, the outer circumference of the first deformable plate 120 may be fixed to the first base 110, and an inner portion of the first deformable plate 120 may be convexly deformed by an external force. The first deformable plate 120 may be deformed while supporting the first substrate S1, and thus, may forcibly deform the first substrate S1. At this time, a curvature of the forcibly-deformed first substrate S1 may be adjusted based on a curvature of the first deformable plate 120.

In embodiments, the first deformable plate 120 may include metal, ceramic, rubber, or a combination thereof. For example, the first deformable plate 120 may include aluminum (Al) or silicon carbide (SiC).

The first pneumatic controller 150 may control pressure of a first cavity 121 provided or defined between the first base 110 and the first deformable plate 120 to deform the first deformable plate 120. The first pneumatic controller 150 may inject air (e.g., using a pump or the like) into the first cavity 121 to increase pressure of the first cavity 121, or may exhaust the air of the first cavity 121 to decrease the pressure of the first cavity 121. When the pressure of the first cavity 121 is increased by the first pneumatic controller 150, the first deformable plate 120 may be deformed to increase a curvature thereof, and moreover, the first substrate S1 supported by the first deformable plate 120 may be deformed to increase a curvature thereof. Also, when the pressure of the first cavity 121 is decreased by the first pneumatic controller 150, the first deformable plate 120 may be deformed to decrease a curvature thereof, and moreover, the first substrate S1 supported by the first deformable plate 120 may be deformed to decrease a curvature thereof.

The plurality of first displacement sensors 140 may sense a displacement of the first deformable plate 120. The plurality of first displacement sensors 140 may be mounted on the first base 110. The plurality of first displacement sensors 140 may be configured to sense vertical-direction distances between different portions of the first deformable plate 120 and the first base 110.

For example, the first displacement sensors 140 may include a laser type displacement sensor, an eddy current type displacement sensor, a capacitance type displacement sensor, and an ultrasonic type displacement sensor.

In embodiments, the second bonding chuck 200 may include a second base 210 and a pressurization pin 215.

The second vacuum groove 230 where vacuum pressure is generated may be provided in the second base 210. The second vacuum pump 290 may apply vacuum pressure to the second vacuum groove 230 so that the second substrate S2 is vacuum-adsorbed or held by the vacuum pressure onto one surface of the second base 210, or may release the vacuum pressure of the second vacuum groove 230 so that vacuum-adsorption of the second substrate S2 is released. The second vacuum groove 230 may include a plurality of vacuum grooves disposed between a center and an outer circumference of the second base 210, and the second vacuum pump 290 may be configured to individually control vacuum pressure provided in each of the plurality of vacuum grooves.

The pressurization pin 215 may be disposed at the center of the second base 210 to be movable in the vertical direction. The pressurization pin 215 may be configured to perform a reciprocating motion in a direction (for example, a Z direction) substantially vertical to the second substrate S2. The pressurization pin 215 may include an actuator for implementing the reciprocating motion. For example, the actuator of the pressurization pin 215 may include a multilayer piezoelectric actuator, a voice coil motor, and a lag or rack and pinion coupled to a motor.

The controller 300 may be configured to overall control a bonding process performed on the first substrate S1 and the second substrate S2 by using the substrate bonding apparatus 10. For example, the controller 300 may be configured to control an operation of the first bonding chuck 100 and an operation of the second bonding chuck 200 and to control a chuck actuator 350 which controls movement of the first bonding chuck 100 and movement of the second bonding chuck 200 (e.g., relative to one another). In embodiments, the controller 300 may be configured to control the bonding process performed on the first substrate S1 and the second substrate S2 on the basis of displacements of the first deformable plate 120 sensed by the plurality of first displacement sensors 140.

The controller 300 may be implemented with hardware, firmware, software, or a combination thereof. For example, the controller 300 may be a computing device such as a workstation computer, a desktop computer, a laptop computer, or a tablet computer. The controller 300 may include a single loop controller, a microprocessor, a central processing unit (CPU), a graphics processing unit (GPU), or a processor configured with software, dedicated hardware, or firmware. The controller 300 may be implemented with, for example, a general-use computer or application specific hardware such as a digital signal processor (DSP), a field programmable gate array (FPGA), or an application specific integrated circuit (ASIC).

In some embodiments, an operation of the controller 300 may be implemented with instructions which are read out by one or more processors and stored in a machine-readable medium. Here, the machine-readable medium may include a mechanism for storing and/or transmitting information as a type readable by a machine (for example, a computing device). For example, the machine-readable medium may include read only memory (ROM), random access memory (RAM), a magnetic disk storage medium, an optical storage medium, a flash memory device, an electrical, optical, acoustic, or other type radio signal (for example, a carrier, an infrared signal, a digital signal, or the like), and other signals.

The controller 300 may be implemented with firmware, software, routine, and instructions for performing a bonding process. For example, the controller 300 may be implemented with software which receives data for feedback, generates a signal for performing the bonding process, and performs an arithmetic operation.

The chamber 11 may surround the first bonding chuck 100 and the second bonding chuck 200. The chamber 11 may provide an internal space for performing the bonding process on the first substrate S1 and the second substrate S2. In embodiments, vacuum pressure or atmospheric pressure may be generated or maintained in the internal space of the chamber 11.

The chamber 11 may include an opening or opening portion 12. The first and second substrates S1 and S2 may be loaded into or unloaded from the internal space of the chamber 11 through the opening portion 12 of the chamber 11. In order to protect the internal space of the chamber 11 from an external environment, the opening portion 12 may be closed or sealed.

Figure 2:
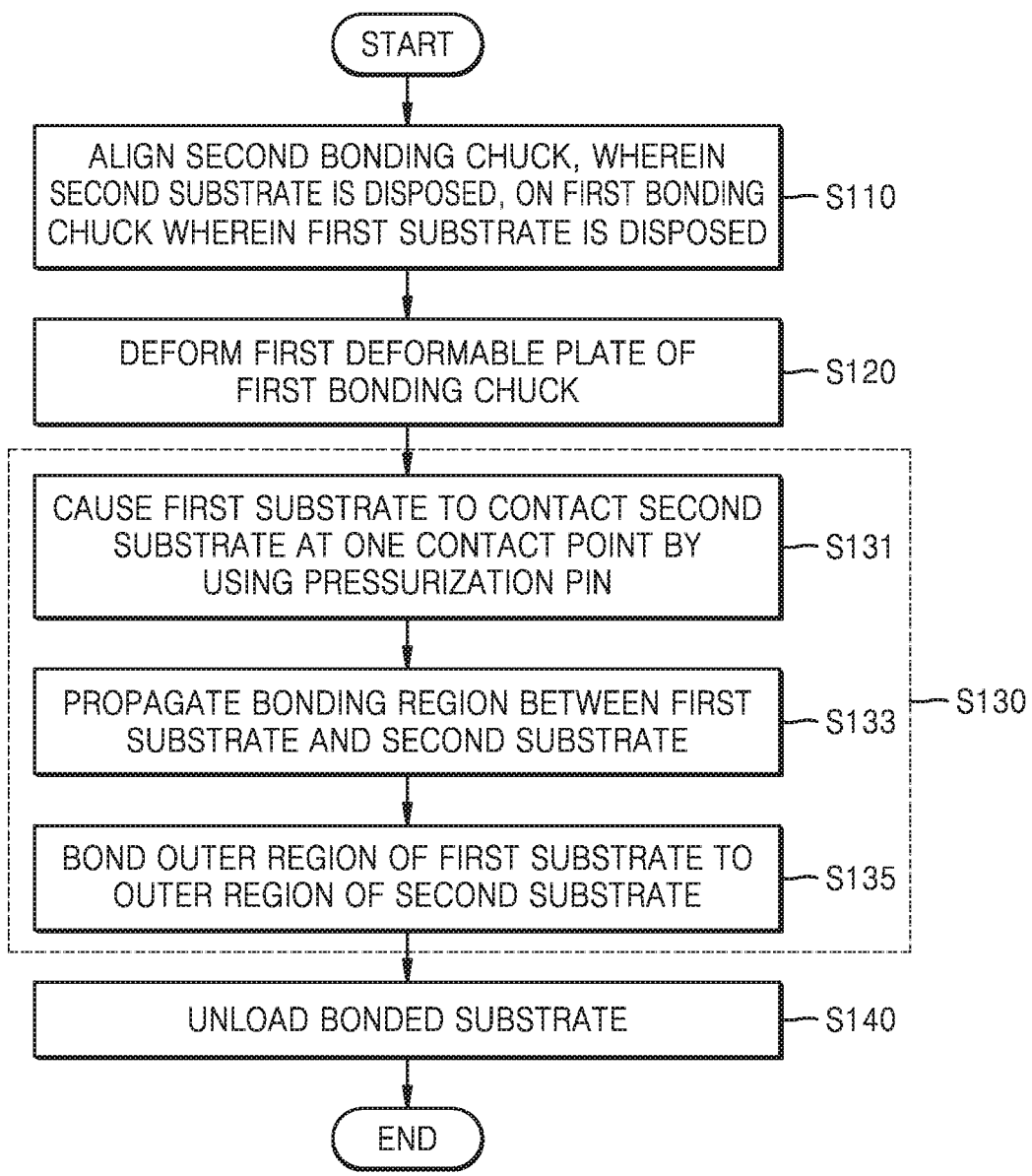
FIG. 2 is a flowchart illustrating a substrate bonding method according to embodiments.

FIG. 2 is a flowchart illustrating a substrate bonding method according to embodiments. FIGS. 3A to 3F are cross-sectional views illustrating a substrate bonding method in sequence, according to embodiments. Hereinafter, a substrate bonding method using a substrate bonding apparatus according to embodiments will be described in detail with reference to FIGS. 2 and 3A to 3F.

Figure 3A:
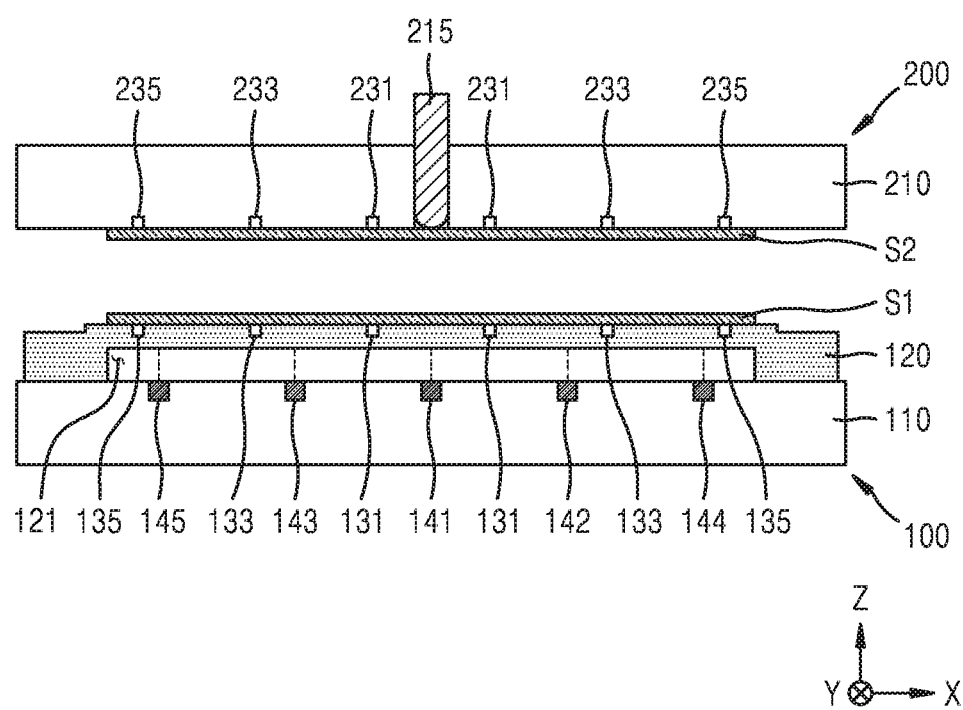
FIGS. 3A to 3F are cross-sectional views sequentially illustrating a substrate bonding method, according to embodiments.

Referring to FIGS. 2 and 3A, the second bonding chuck 200, on which the second substrate S2 is arranged, may be aligned with the first bonding chuck 100, on which the first substrate S1 arranged, in operation S110.

In operation S110, the first substrate S1 may be mounted on the first bonding chuck 100 such that an inactive surface of the first substrate S1 contacts the first bonding chuck 100, and the second substrate S2 may be mounted on the second bonding chuck 200 such that an inactive surface of the second substrate S2 contacts the second bonding chuck 200. A second bonding surface of the second substrate S2 mounted on the second bonding chuck 200 may face a first bonding surface of the first substrate S1 mounted on the first bonding chuck 100.

The first bonding chuck 100 may generate vacuum pressure in each of a first center vacuum groove 131 for vacuum-adsorbing or holding with the vacuum pressure a center region of the first substrate S1, a first middle vacuum groove 133 for vacuum-adsorbing or holding with the vacuum pressure a middle region between the center region and an outer region of the first substrate S1, and a first outer vacuum groove 135 for vacuum-adsorbing or holding with the vacuum pressure the outer region of the first substrate S1, for supporting the first substrate S1. Also, the second bonding chuck 200 may generate vacuum pressure in each of a second center vacuum groove 231 for vacuum-adsorbing a center region of the second substrate S2, a second middle vacuum groove 233 for vacuum-adsorbing a middle region between the center region and an outer region of the second substrate S2, and a second outer vacuum groove 235 for vacuum-adsorbing the outer region of the second substrate S2, for supporting the second substrate S2.

In operation S110, the first bonding chuck 100 and the second bonding chuck 200 may be aligned in a vertical direction (for example, the Z direction). In order to align the first bonding chuck 100 and the second bonding chuck 200, at least one selected from the first bonding chuck 100 and the second bonding chuck 200 may move in a horizontal direction (for example, an X direction and/or a Y direction), and moreover, may rotate with respect to the vertical direction (for example, the Z direction).

Figure 3B:
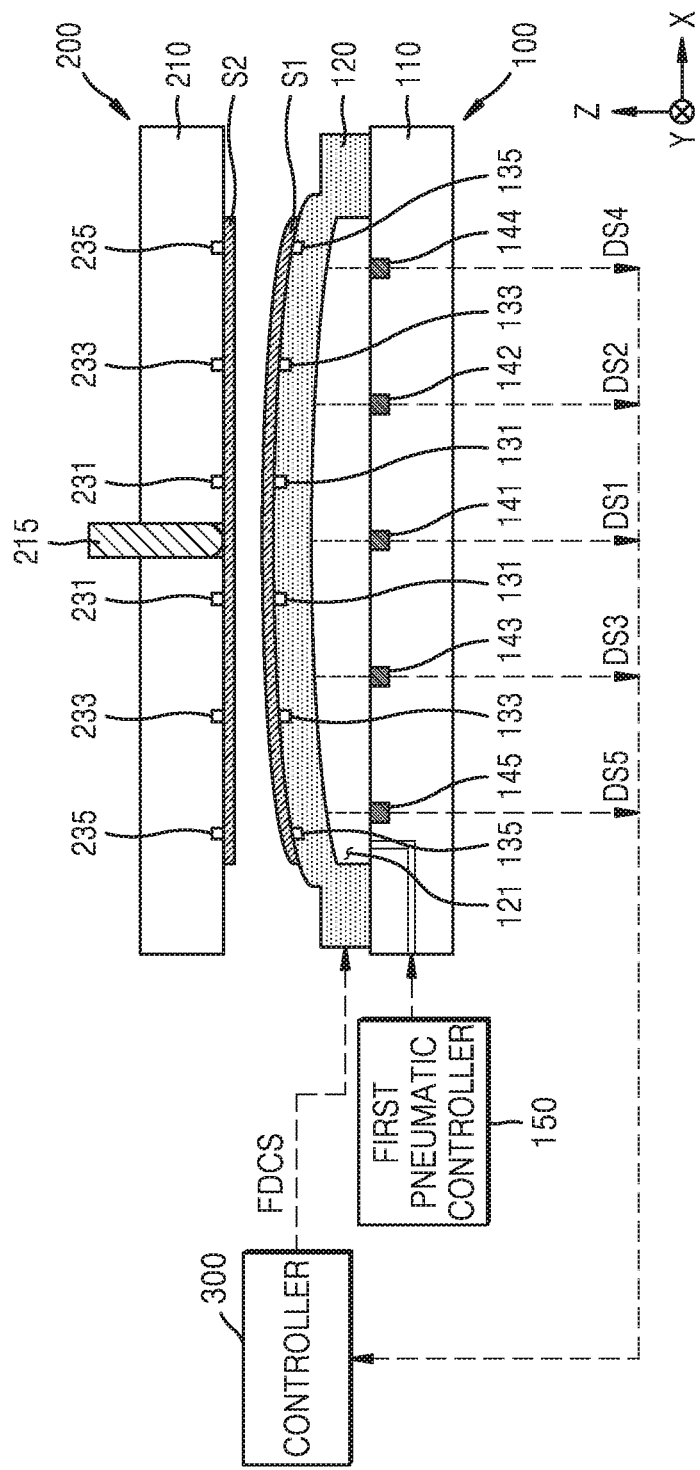

Referring to FIGS. 2 and 3B, the first bonding chuck 100 and the second bonding chuck 200 may be aligned, and then, the first deformable plate 120 of the first bonding chuck 100 may be deformed in operation S120.

In operation S120, the first deformable plate 120 may be deformed while supporting the first substrate S1, and thus, may forcibly deform the first substrate S1 supported on one surface of the first deformable plate 120. For example, the first deformable plate 120 may be deformed convexly in an upward direction while vacuum-adsorbing the first substrate S1 or holding the first substrate S1 with the vacuum pressure, and the first substrate S1 may be forcibly deformed convexly in an upward direction according to the deformation level of the first deformable plate 120. In this case, the first substrate S1 may be forcibly deformed while being adhered to the first deformable plate 120, and thus, the forcibly-deformed first substrate S1 may have a curvature corresponding to a curvature of one surface of the first deformable plate 120.

In embodiments, deformation of the first deformable plate 120 may include an operation of convexly deforming the first deformable plate 120 primarily and an operation of secondarily deforming the first deformable plate 120 on the basis of displacements of the primarily-deformed first deformable plate 120 sensed by the plurality of first displacement sensors 140. The secondary deformation of the first deformable plate 120 may be an operation of locally correcting the amount of deformation of the first deformable plate 120 on the basis of the displacements of the primarily-deformed first deformable plate 120 sensed by the plurality of first displacement sensors 140.

When deformation of the first deformable plate 120 is completed, bonding between the first substrate S1 and the second substrate S2 may be performed in operation S130. In embodiments, the bonding between the first substrate S1 and the second substrate S2 may include an operation (S131) of causing the first substrate S1 to contact the second substrate S2 at one contact point therebetween, an operation (S133) of propagating a bonding region between the first substrate S1 and the second substrate S2, and an operation (S135) of bonding the outer region of the first substrate S1 to the outer region of the second substrate S2.

Figure 3C:
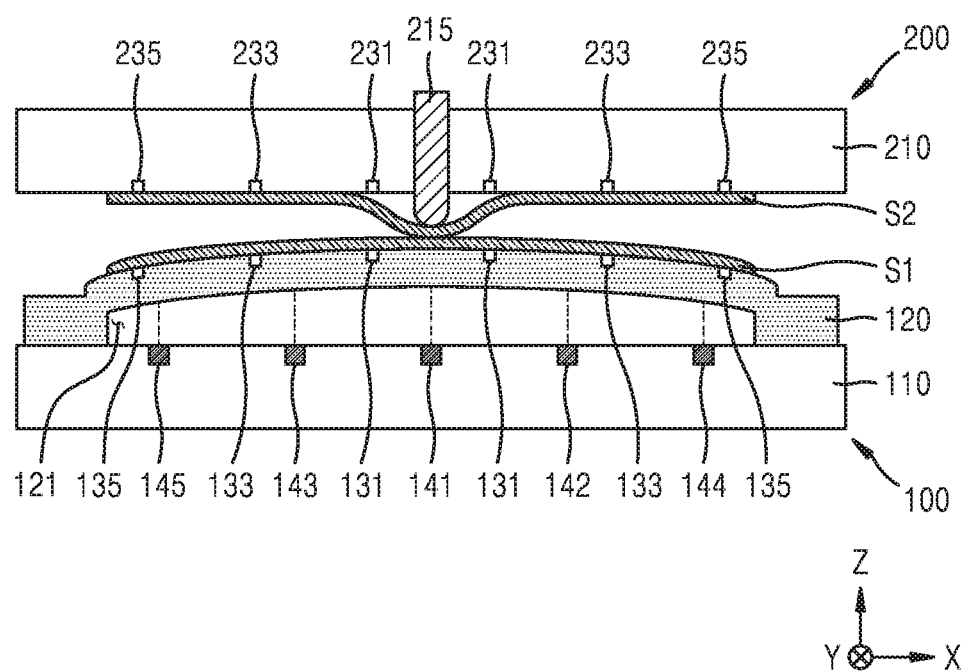

Referring to FIGS. 2 and 3C, in operation S131, the second bonding chuck 200 may release vacuum pressure corresponding to the second center vacuum groove 231 and may maintain vacuum pressure corresponding to each of the second middle vacuum groove 233 and the second outer vacuum groove 235. In a state where vacuum-adsorption or vacuum adherence of a center region of the second substrate S2 is released, the pressurization pin 215 may push and pressurize the center of the second substrate S2, and thus, the center region of the second substrate S2 pressurized by the pressurization pin 215 may be convexly deformed and may contact the one contact point between the first substrate S1 and the second substrate S2. The one contact point may be defined as a bonding initiation point from which bonding performed on the first substrate S1 and the second substrate S2 starts. For example, the bonding initiation point may be a point at which a center of the first bonding surface of the first substrate S1 contacts a center of the second bonding surface of the second substrate S2.

Figure 3D:
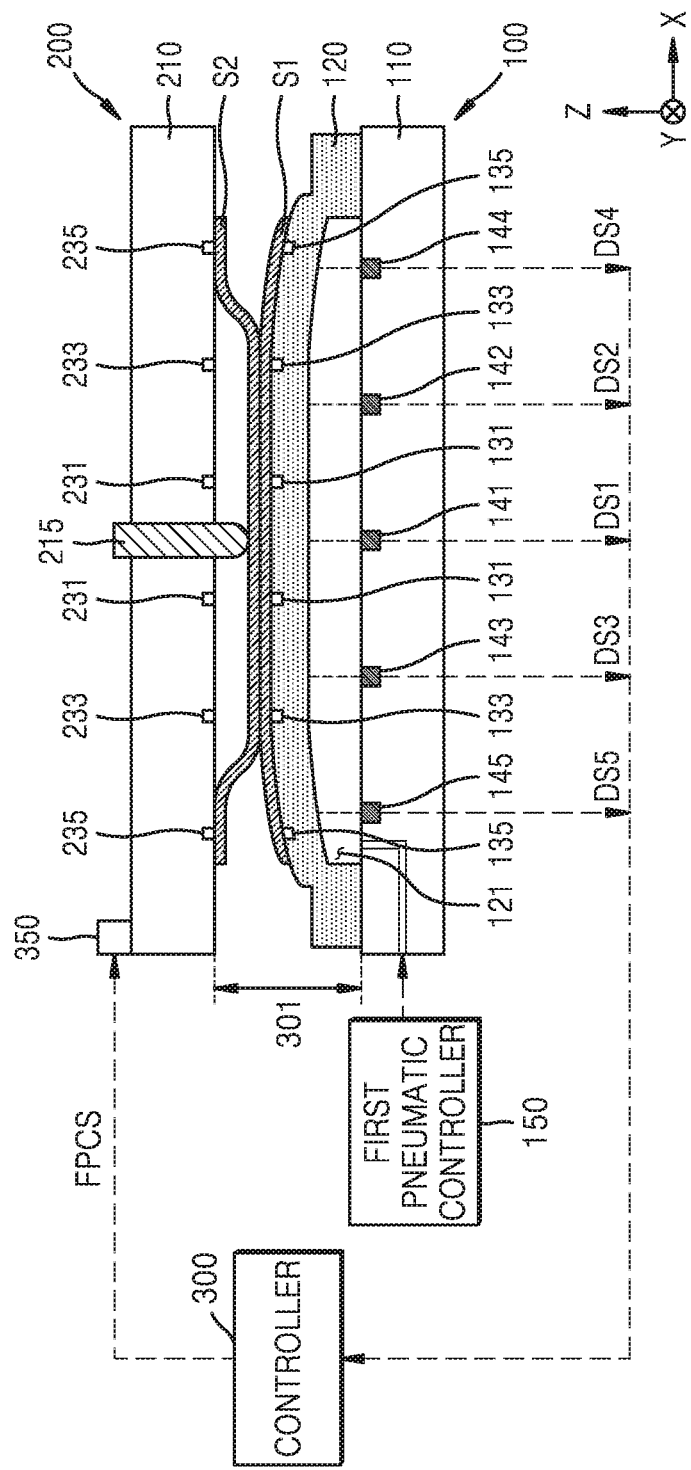

Referring to FIGS. 2 and 3D, in operation S133, vacuum-adsorption or vacuum adherence of the second substrate S2 may be progressively released in a direction from the center of the second substrate S2 to the outer region of the second substrate S2, thereby allowing propagation of the bonding region between the first substrate S1 and the second substrate S2. When the second bonding chuck 200 releases vacuum pressure applied to the second middle vacuum groove 233, bonding between the first substrate S1 and the second substrate S2 may be spontaneously performed without another external force being applied thereto. Based on spontaneous bonding propagation between the first substrate S1 and the second substrate S2, the center region and the middle region of the first substrate S1 may be bonded to the center region and the middle region of the second substrate S2.

In embodiments, each of the first bonding surface of the first substrate S1 and the second bonding surface of the second substrate S2 may include a plasma-processed or wet-processed surface. For example, each of the first bonding surface of the first substrate S1 and the second bonding surface of the second substrate S2 may have a functional group of —OH, and thus, a functional group of —OH of the first bonding surface of the first substrate S1 may be spontaneously bonded to the functional group of —OH of the second bonding surface of the second substrate S2 via a hydrogen bond during the bonding between the first substrate S1 and the second substrate S2.

In operation S133, when bonding between the first substrate S1 and the second substrate S2 is propagated, the chuck actuator 350 may decrease a distance 301 between the first bonding chuck 100 and the second bonding chuck 200 to flatten the center region of the first deformable plate 120 surrounded by the first center vacuum groove 131 and flatten the middle region of the second deformable plate 220 between the first center vacuum groove 131 and the first middle vacuum groove 133. In this case, the first pneumatic controller 150 may lower pressure of the first cavity 121, for helping flatten the center region and the middle region of the first deformable plate 120. As the center region and the middle region of the first deformable plate 120 are flattened, the first bonding surface of the first substrate S1 may be flatly bonded to the second bonding surface of the second substrate S2.

When bonding between the first substrate S1 and the second substrate S2 is propagated, the controller 300 may determine whether deformation of the first deformable plate 120 is appropriately performed, based on displacements sensed by the plurality of first displacement sensors 140. For example, the controller 300 may determine whether the center region and the middle region of the first deformable plate 120 are deformed in a flat state, based on the displacements sensed by the plurality of first displacement sensors 140. For example, when it is determined that deformation of the first deformable plate 120 is not appropriately performed, the controller 300 may apply a feedback position control signal FPCS, generated based on the displacements sensed by the plurality of first displacement sensors 140, to the chuck actuator 350, and the chuck actuator 350 may adjust the distance 301 between the first bonding chuck 100 and the second bonding chuck 200 according to the feedback position control signal FPCS.

In embodiments, the controller 300 may determine whether a displacement of the center of the first deformable plate 120 sensed by a first sub-displacement sensor 141 matches a displacement of the middle region of the first deformable plate 120 sensed by a second sub-displacement sensor 142. When the displacement of the center of the first deformable plate 120 differs from that of the middle region of the first deformable plate 120, the controller 300 may apply the feedback position control signal FPCS to the chuck actuator 350, and the chuck actuator 350 may adjust the distance 301 between the first bonding chuck 100 and the second bonding chuck 200 until the displacement of the center of the first deformable plate 120 matches the displacement of the middle region of the first deformable plate 120.

In embodiments, while the bonding region between the first substrate S1 and the second substrate S2 is being propagated, the controller 300 may determine whether the displacement of the center of the first deformable plate 120 sensed by the first sub-displacement sensor 141 is within a predetermined reference range. In this case, when the displacement of the center of the first deformable plate 120 sensed by the first sub-displacement sensor 141 is outside the predetermined reference range, the controller 300 may apply the feedback position control signal FPCS to the chuck actuator 350, and the chuck actuator 350 may adjust the distance 301 between the first bonding chuck 100 and the second bonding chuck 200 until the displacement of the center of the first deformable plate 120 is adjusted to be within the predetermined reference range.

Figure 3E:
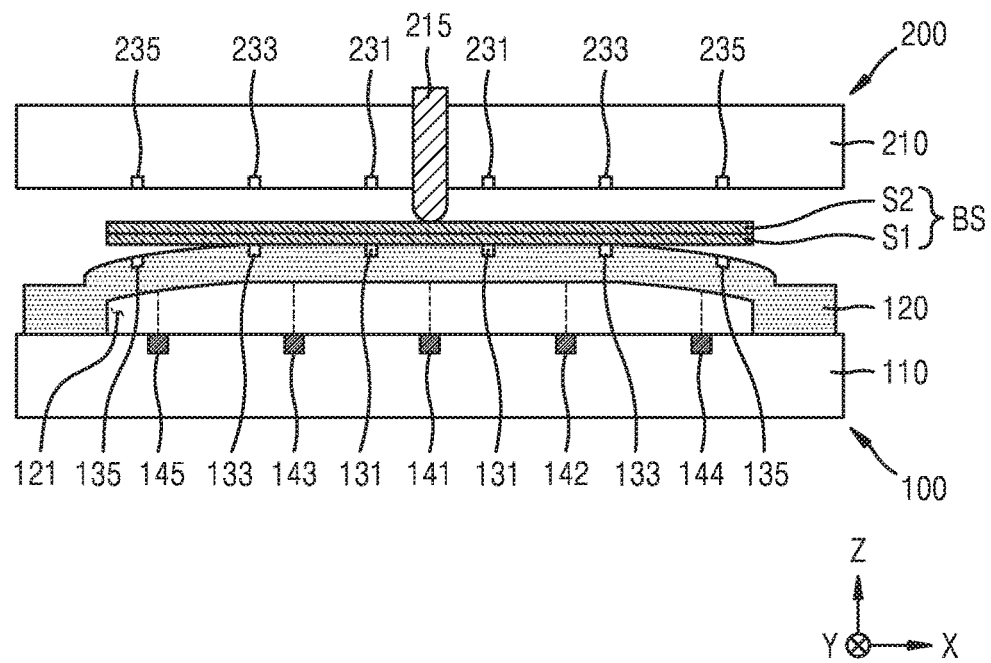

Referring to FIGS. 2 and 3E, in operation S135, when the second bonding chuck 200 releases vacuum pressure applied to the second outer vacuum groove 235 and the first bonding chuck 100 releases vacuum pressure applied to the first outer vacuum groove 135, bonding between the outer region of the first substrate S1 and the outer region of the second substrate S2 may be spontaneously performed without another external force being applied thereto. When the bonding between the outer region of the first substrate S1 and the outer region of the second substrate S2 is completed, a bonded substrate BS where the first bonding surface of the first substrate S1 is bonded to the second bonding surface of the second substrate S2 may be formed.

Figure 3F:
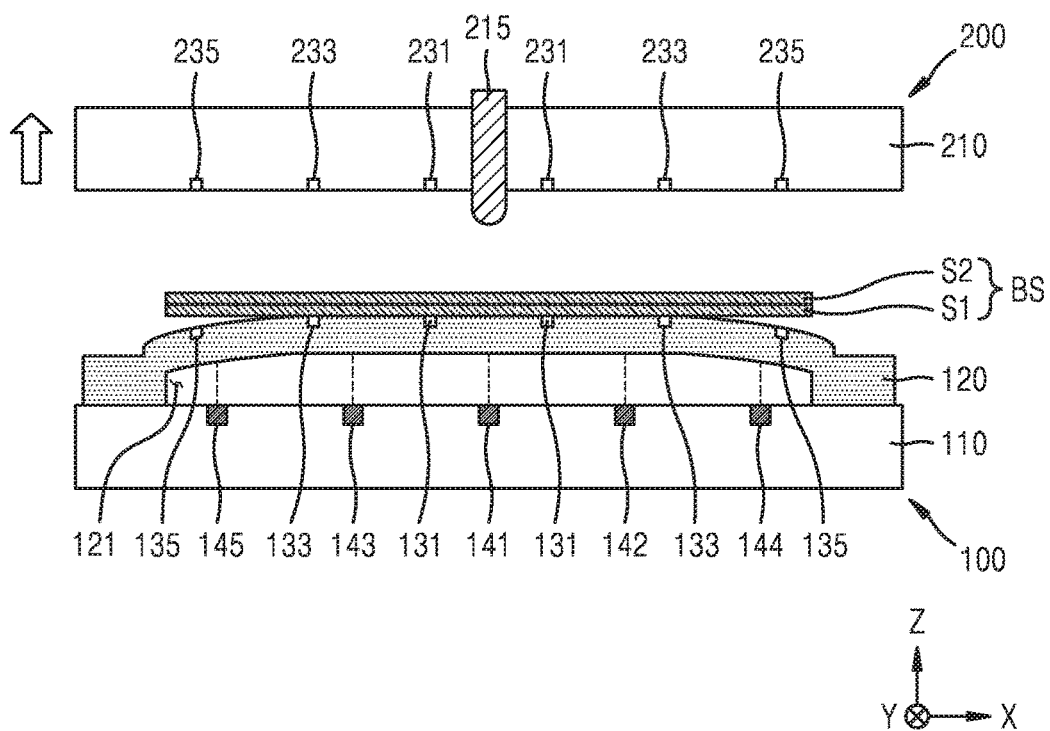

Referring to FIGS. 2 and 3F, when the bonding between the first substrate S1 and the second substrate S2 is completed, the bonded substrate BS may be unloaded in operation S140. In order to unload the bonded substrate BS, the second bonding chuck 200 may move in a direction away from the first bonding chuck 100, and the first bonding chuck 100 may wholly release vacuum-adsorption or vacuum adherence of the bonded substrate BS.

Figure 4:
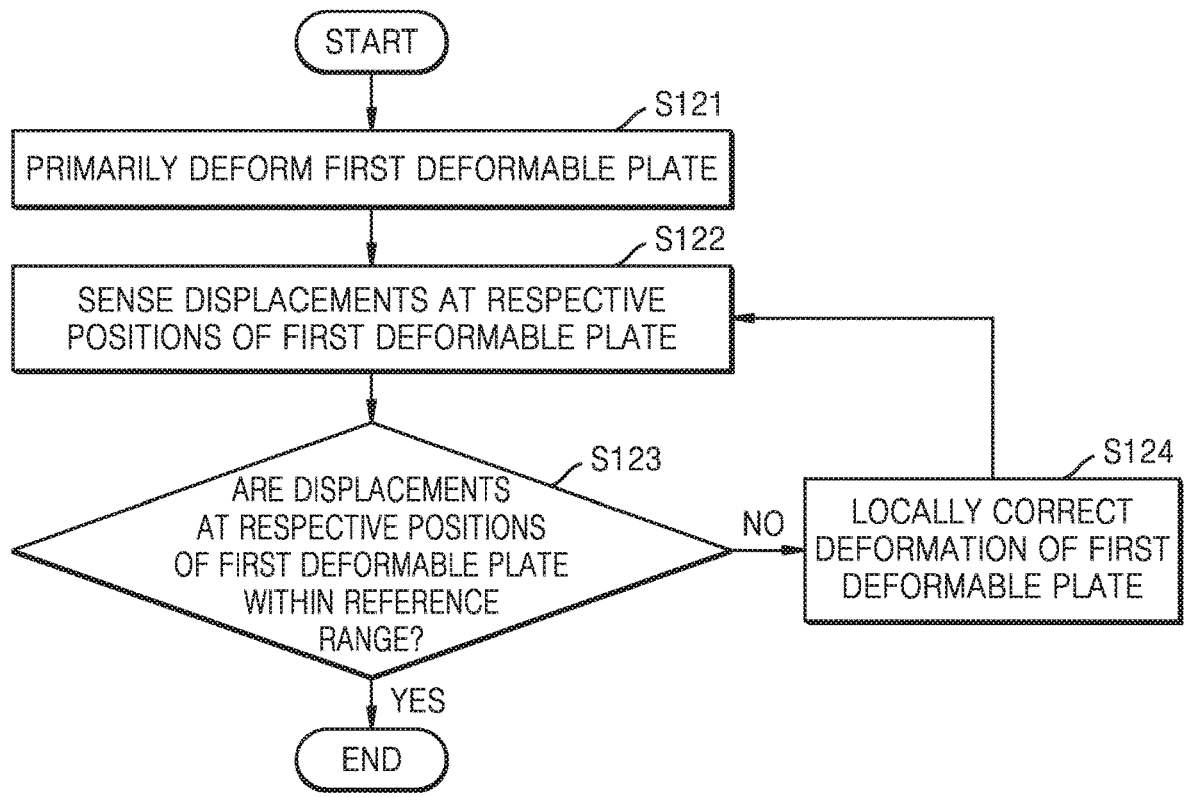
FIG. 4 is a flowchart illustrating a method of deforming a first deformable plate, according to embodiments.

FIG. 4 is a flowchart illustrating a method of deforming the first deformable plate 120, according to embodiments. Hereinafter, operation S120 of FIG. 2 will be described in more detail with reference to FIGS. 3B and 4.

First, in operation S121, the first deformable plate 120 may be primarily deformed to have an upward convex shape in operation S121. For example, the first bonding chuck 100 may inject air into the first cavity 121 by using the first pneumatic controller 150. As pressure of the first cavity 121 increases, the first deformable plate 120 and the first substrate S1 supported by the first deformable plate 120 may be deformed convexly in an upward direction.

Subsequently, in operation S122, the plurality of first displacement sensors 140 may sense displacements at respective positions of the primarily-deformed first deformable plate 120. The plurality of first displacement sensors may be disposed at different positions on an X-Y plane and may measure Z-direction displacements of different portions of the first deformable plate 120. The displacements at respective positions of the first deformable plate 120 on X-Y coordinates may be obtained based on the displacements of the first deformable plate 120 sensed by the plurality of first displacement sensors 140.

For example, the plurality of first displacement sensors 140 may include the first sub-displacement sensor 141 for sensing a displacement of the center of the first deformable plate 120, second and third sub-displacement sensors 142 and 143 for sensing a displacement between the center and the outer region of the first deformable plate 120, and fourth and fifth sub-displacement sensors 144 and 145 for sensing a displacement of the outer region of the first deformable plate 120. The first to fifth sub-displacement sensors 141 to 145 may transmit first to fifth displacement signals DS1 to DS5 to the controller 300, and the controller 300 may obtain data of the displacements at respective positions of the first deformable plate 120 on the basis of the first to fifth displacement signals DS1 to DS5.

Subsequently, in operation S123, the controller 300 may determine whether each of the displacements at respective positions of the first deformable plate 120 sensed by the plurality of first displacement sensors 140 is within the predetermined reference range. That is, the controller 300 may perform an operation of receiving the displacements of the primarily-deformed first deformable plate 120 sensed by the plurality of first displacement sensors 140 and determining whether each of the sensed displacements of the primarily-deformed first deformable plate 120 is within the predetermined reference range. In this case, the amount of deformation of the primarily-deformed first deformable plate 120 may vary based on a position of the first deformable plate 120, and thus, the reference range may be differently set based on the positon of the first deformable plate 120.

When it is determined that each of the displacements at respective positions of the first deformable plate 120 sensed by the plurality of first displacement sensors 140 is within the predetermined reference range, an operation (S130) of performing bonding between the first substrate S1 and the second substrate S2 may be performed.

Alternatively, when it is determined that at least one of the displacements at respective positions of the first deformable plate 120 sensed by the plurality of first displacement sensors 140 is outside the predetermined reference range, an operation (S124) of locally correcting deformation of the first deformable plate 120 may be subsequently performed. When deformation of the first deformable plate 120 is locally corrected through operation S124, operation S122 and operation S123 may be performed again.

Operation S124 may sequentially perform an operation of detecting a position where a displacement of the primarily-deformed first deformable plate 120 is outside the reference range, an operation of calculating the amount of deformation needed for adjusting the displacement of the first deformable plate 120 to within the reference range at the detected position, and an operation of locally deforming the first deformable plate 120 at the detected position on the basis of the calculated amount of deformation. Operation S124 will be described below in detail with reference to FIG. 7 or FIGS. 8A and 8B.

According to embodiments, a deformation state of the first deformable plate 120 may be monitored by using the plurality of first displacement sensors 140, and deformation of the first deformable plate 120 may be feedback-controlled, thereby uniformly managing deformation of the first deformable plate 120 and deformation of the first substrate S1 caused by the first deformable plate 120. A bonding process may be performed on two substrates in a state where the first substrate S1 is deformed to be constant or as desired, and thus, reliability of a substrate bonding process may be enhanced.

FIGS. 5A to 5F are cross-sectional views illustrating a substrate bonding method in sequence, according to embodiments. Hereinafter, a substrate bonding method using a substrate bonding apparatus according to embodiments will be described in detail with reference to FIGS. 5A to 5F. Except for a configuration of a second bonding chuck 200a, the substrate bonding apparatus illustrated in FIGS. 5A to 5F may be substantially the same as or similar to the substrate bonding apparatus illustrated in FIGS. 3A to 3F. For convenience of description and in the interest of brevity, descriptions which are the same as or similar to the above descriptions may be omitted.

Figure 5A:
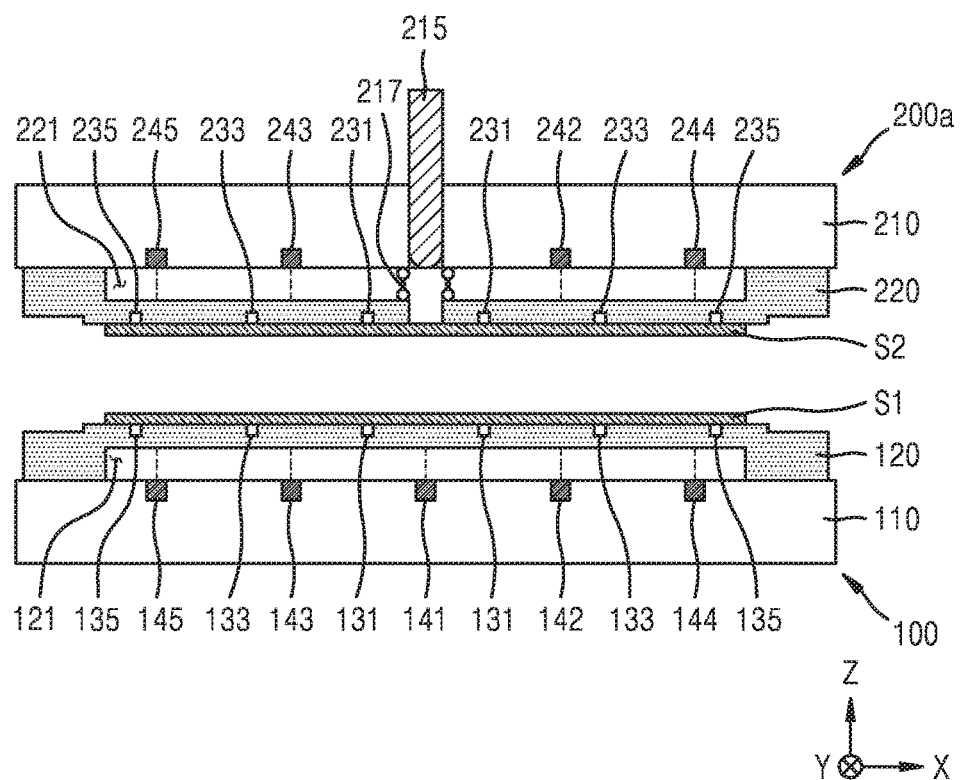
FIGS. 5A to 5F are cross-sectional views sequentially illustrating a substrate bonding method, according to embodiments.

Referring to FIG. 5A, a second bonding chuck 200a with a second substrate S2 disposed thereon may be aligned on or with a first bonding chuck 100 with a first substrate S1 disposed thereon.

The first bonding chuck 200a may include a second base 210, a second deformable plate 220 disposed on the second base 210, and a plurality of second displacement sensors.

The second deformable plate 220 may support a second substrate S2. A plurality of second vacuum grooves 230 where vacuum pressure is generated may be provided in the second deformable plate 220. The second bonding chuck 200a may generate vacuum pressure in each of a second center vacuum groove 231 corresponding to a center region of the second substrate S2, a second middle vacuum groove 233 corresponding to a middle region of the second substrate S2, and a second outer vacuum groove 235 corresponding to an outer region of the second substrate S2, for supporting the second substrate S2.

An outer circumference of the second deformable plate 220 may be fixed to the second base 210, and an inner portion of the second deformable plate 220 may be convexly deformed by an external force. The second deformable plate 220 may be deformed while supporting the second substrate S2, and thus, may forcibly deform the second substrate S2. At this time, a curvature of the forcibly-deformed second substrate S2 may be adjusted based on a curvature of the second deformable plate 220.

The second bonding chuck 200a may control pressure of a second cavity 221 provided between the second base 210 and the second deformable plate 220 to deform the second deformable plate 220. For example, the second bonding chuck 200a may control pressure of the second cavity 221 by using a second pneumatic controller (250 of FIG. 5B) configured to inject or exhaust air into or from the second cavity 221.

A sealing material or sealing member 217 for preventing external air from penetrating into the second cavity 221 may be disposed between the second deformable plate 220 and the second base 210. The sealing material 217 may detach or seal the second cavity 221 from a hole of the second base 210 accommodating a pressurization pin 215. The sealing material 217 may have a cylinder shape and include a path through which the pressurization pin 215 may pass. One end of the sealing material 217 may be fixed to the second base 210, and the other end of the sealing material 217 may be fixed to the second deformable plate 220. The sealing material 217 may be configured to be shortened or elongated in a vertical direction according to the deformation level of the second deformable plate 220.

The plurality of second displacement sensors may sense a displacement of the second deformable plate 220. The plurality of second displacement sensors may be mounted on the second base 210. The plurality of second displacement sensors may be configured to sense vertical-direction distances between different portions of the second deformable plate 220 and the second base 210. For example, the second displacement sensors may include a laser type displacement sensor, an eddy current type displacement sensor, a capacitance type displacement sensor, and an ultrasonic type displacement sensor.

For example, the plurality of second displacement sensors may include a sixth sub-displacement sensor (not shown) for sensing a displacement of a center of the second deformable plate 220, seventh and eighth sub-displacement sensors 242 and 243 for sensing a displacement between the center and an outer region of the second deformable plate 220, and ninth and tenth sub-displacement sensors 244 and 245 for sensing a displacement of the outer region of the second deformable plate 220. The sixth sub-displacement sensor may be disposed to correspond to (e.g., be aligned with) the first sub-displacement sensor 141, the seventh and eighth sub-displacement sensors 242 and 243 may be disposed to respectively correspond to (e.g., be aligned with) the second and third sub-displacement sensors 142 and 143, and the ninth and tenth sub-displacement sensors 244 and 245 may be disposed to respectively correspond to (e.g., be aligned with) the fourth and fifth sub-displacement sensors 144 and 145. The plurality of second displacement sensors may transmit sixth to tenth displacement signals DS6 to DS10 to the controller 300, and the controller 300 may obtain data of displacements at respective positions of the second deformable plate 220 on the basis of the sixth to tenth displacement signals DS6 to DS10.

Figure 5B:
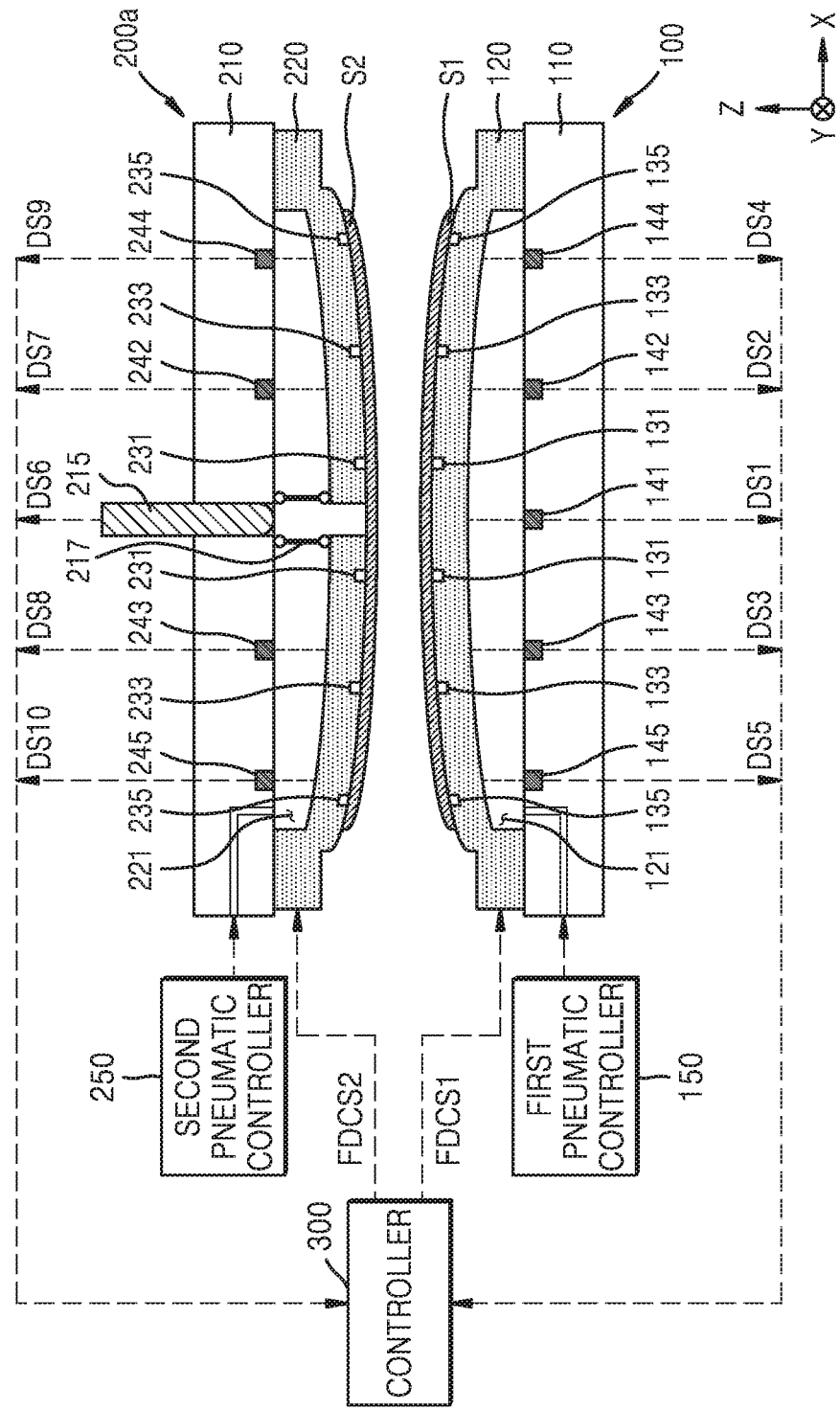

Referring to FIG. 5B, the first bonding chuck 100 and the second bonding chuck 200a may be aligned, and then, a first deformable plate 120 of the first bonding chuck 100 may deform the second deformable plate 220 of the second bonding chuck 200a. In detail, the first deformable plate 120 may be deformed convexly in an upward direction while supporting the first substrate S1, and thus, the first substrate S1 may be forcibly deformed convexly in an upward direction according to the deformation level of the first deformable plate 120. The second deformable plate 220 may be deformed convexly in a downward direction while supporting the second substrate S2, and the second substrate S2 may be deformed convexly in a downward direction according to the deformation level of the second deformable plate 220. In embodiments, the first deformable plate 120 and the second deformable plate 220 may be deformed to have a symmetrical shape.

In embodiments, deformation of the first deformable plate 120 may include an operation of convexly deforming the first deformable plate 120 primarily and an operation of secondarily deforming the first deformable plate 120 on the basis of displacements of the primarily-deformed first deformable plate 120 sensed by a plurality of first displacement sensors. Also, deformation of the second deformable plate 220 may include an operation of convexly deforming the second deformable plate 220 primarily and an operation of secondarily deforming the second deformable plate 220 on the basis of displacements of the primarily-deformed second deformable plate 220 sensed by the plurality of second displacement sensors.

The controller 300 may control secondary deformation of the first deformable plate 120 and second deformation of the second deformable plate 220. The controller 300 may be configured to generate a feedback deformation control signal FDCS1 for correcting the amount of deformation of the first deformable plate 120 on the basis of displacements of the primarily-deformed first deformable plate 120 sensed by the plurality of first displacement sensors and apply the generated feedback deformation control signal FDCS1 to the first bonding chuck 100. Also, the controller 300 may be configured to generate a feedback deformation control signal FDCS2 for correcting the amount of deformation of the second deformable plate 220 on the basis of displacements of the primarily-deformed second deformable plate 220 sensed by the plurality of second displacement sensors and apply the generated feedback deformation control signal FDCS2 to the second bonding chuck 200a.

Figure 5C:
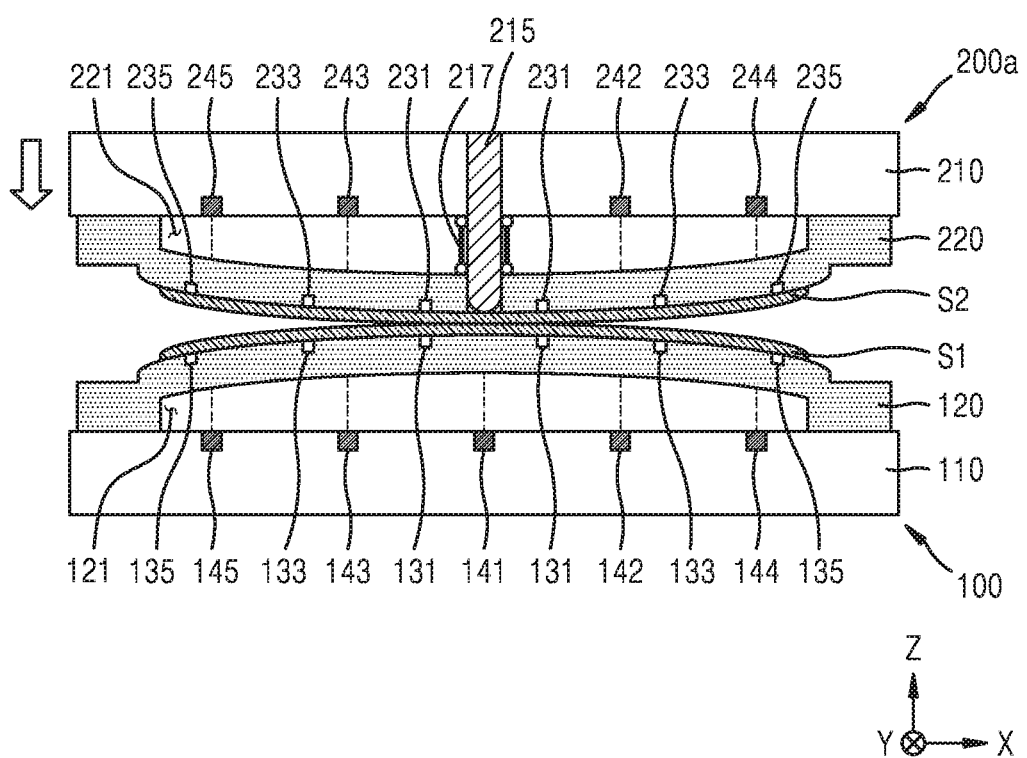

Referring to FIG. 5C, when deformation of each of the first deformable plate 120 and the second deformable plate 220 is completed, the second bonding chuck 200a may be lowered by a certain distance and may push and pressurize a center of the second substrate S2 toward the first substrate S1 by using the pressurization pin 215. In a state where vacuum-adsorption or vacuum adherence of a center region of the second substrate S2 is released, the pressurization pin 215 may push and pressurize the center of the second substrate S2, and thus, the center of the second substrate S2 may contact the first substrate S1 at one contact point therebetween.

Figure 5D:
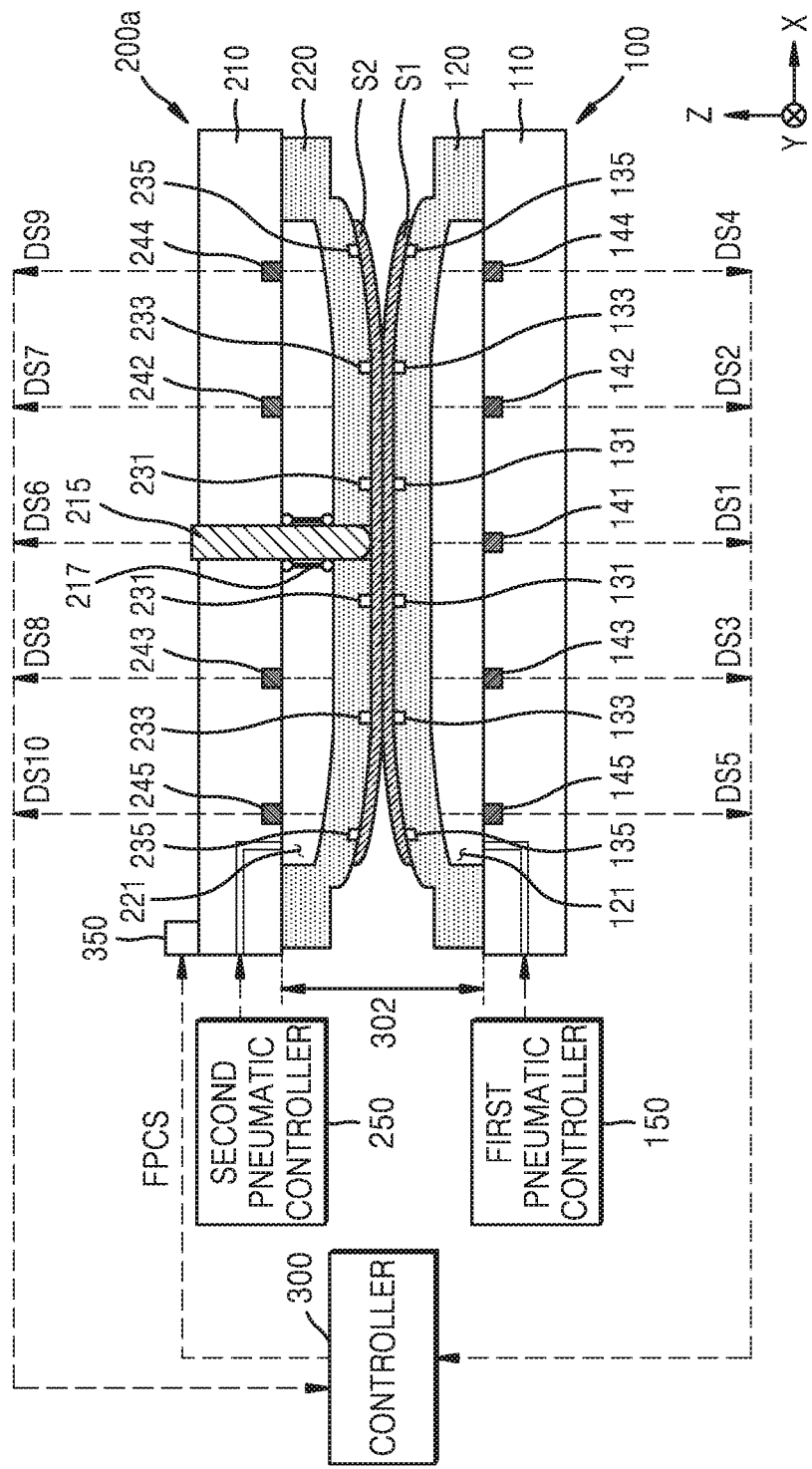

Referring to FIG. 5D, when the first substrate S1 contacts the second substrate S2 at one contact point therebetween, bonding propagation between the first substrate S1 and the second substrate S2 may be allowed. For example, vacuum-adsorption or vacuum adherence of the second substrate S2 may be progressively released in a direction from the center to the outer region of the second substrate S2, and the first bonding chuck 100 may progressively release vacuum-adsorption or vacuum adherence of the first substrate S1 in a direction from the center to the outer region of the first substrate S1, whereby a bonding region between the first substrate S1 and the second substrate S2 may be progressively propagated.

When bonding between the first substrate S1 and the second substrate S2 is propagated, a chuck actuator 350 may decrease a distance 302 between the first bonding chuck 100 and the second bonding chuck 200a to flatten a center region and a middle region of the first deformable plate 120 and flatten a center region and a middle region of the second deformable plate 220. In this case, a first pneumatic controller 150 and a second pneumatic controller 250 may respectively lower pressure of the first cavity 121 and pressure of the second cavity 221, for helping flatten the center region and the middle region of the first deformable plate 120 and flatten the center region and the middle region of the second deformable plate 220. As the center region and the middle region of the first deformable plate 120 and the center region and the middle region of the second deformable plate 220 are flattened, a first bonding surface of the first substrate S1 may be flatly bonded to a second bonding surface of the second substrate S2.

When bonding between the first substrate S1 and the second substrate S2 is propagated, the controller 300 may determine whether deformation of the first deformable plate 120 and deformation of the second deformable plate 220 are appropriately performed, based on displacement signals DS1 to DS5 sensed by the plurality of first displacement sensors and displacement signals DS6 to DS10 sensed by the plurality of second displacement sensors. For example, the controller 300 may determine whether the center region and the middle region of the first deformable plate 120 are deformed in a flat state, based on the displacements sensed by the plurality of first displacement sensors, and the center region and the middle region of the second deformable plate 220 are deformed in a flat state, based on the displacements sensed by the plurality of second displacement sensors. For example, when it is determined that deformation of the first deformable plate 120 and deformation of the second deformable plate 220 are not appropriately performed, the controller 300 may generate a feedback position control signal FPCS on the basis of the displacements of the first deformable plate 120 sensed by the plurality of first displacement sensors and the displacements of the second deformable plate 220 sensed by the plurality of second displacement sensors and may apply the generated feedback position control signal FPCS to the chuck actuator 350. The chuck actuator 350 may adjust the distance 302 between the first bonding chuck 100 and the second bonding chuck 200a according to the feedback position control signal FPCS.

Figure 5E:
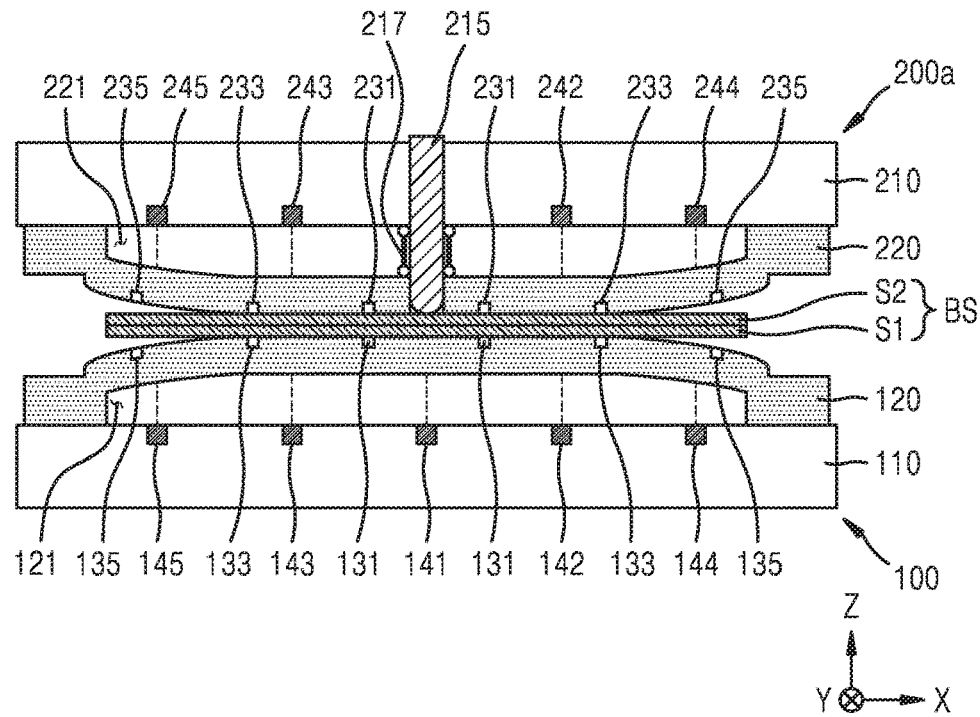

Referring to FIG. 5E, an outer region of the first substrate S1 may be bonded to an outer region of the second substrate S2. The first bonding chuck 100 may vacuum-adsorb or vacuum hold a center region and a middle region of the first substrate S1 on which bonding is completed and may release vacuum-adsorption or vacuum adherence of the outer region of the first substrate S1. Also, the second bonding chuck 200a may vacuum-adsorb or vacuum hold a center region and a middle region of the second substrate S2 on which bonding is completed and may release vacuum-adsorption or vacuum adherence of the outer region of the second substrate S2. When the vacuum-adsorption or vacuum adherence of the outer region of the first substrate S1 and the vacuum-adsorption or vacuum adherence of the outer region of the second substrate S2 are released, the outer region of the first substrate S1 may be spontaneously bonded to the outer region of the second substrate S2.

Figure 5F:
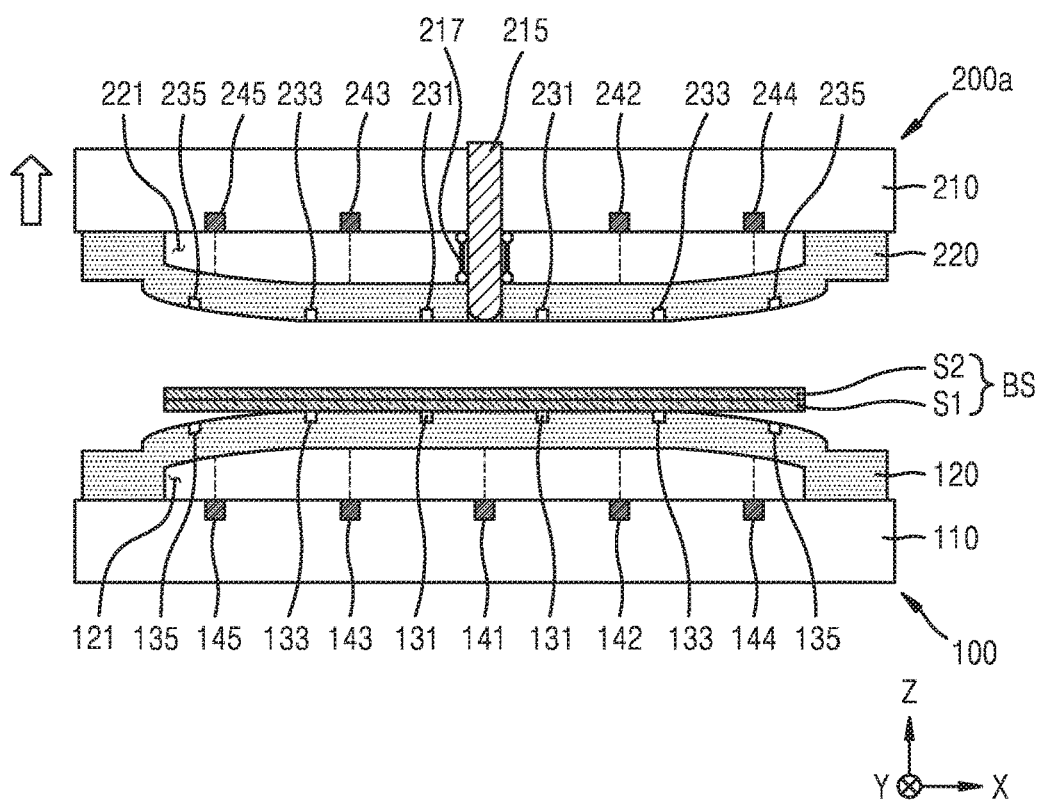

Referring to FIG. 5F, when bonding between the first substrate S1 and the second substrate S2 is completed, the bonded substrate BS may be unloaded. In order to unload the bonded substrate BS, the first bonding chuck 100 and the second bonding chuck 200a may wholly release vacuum-adsorption or vacuum adherence of the bonded substrate BS, and the second bonding chuck 200a may move in a direction away from the first bonding chuck 100.

Figure 6:
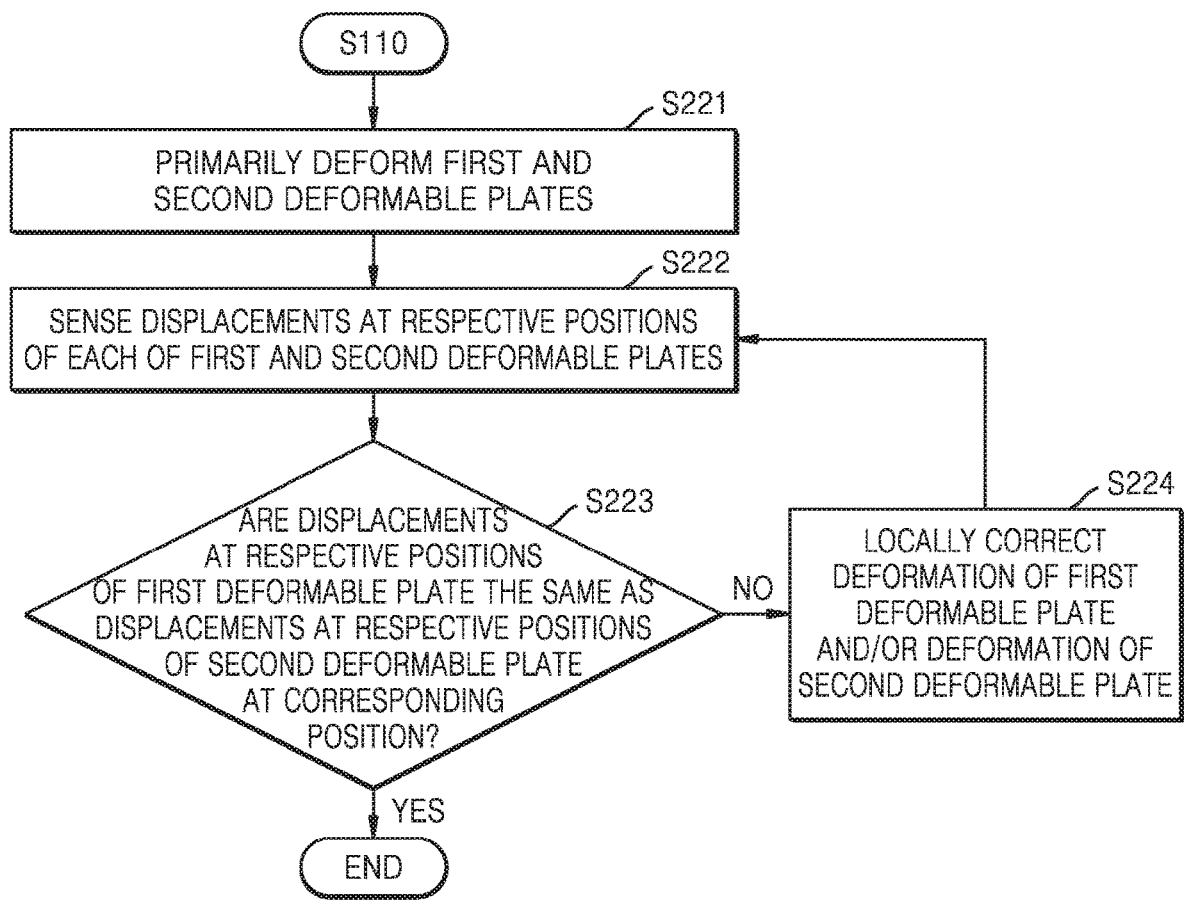
FIG. 6 is a flowchart illustrating a method of deforming a first deformable plate and a second deformable plate, according to embodiments.

FIG. 6 is a flowchart illustrating a method of deforming the first deformable plate 120 and the second deformable plate 220, according to embodiments. Hereinafter, a method of deforming the first deformable plate 120 and the second deformable plate 220 will be described in more detail with reference to FIGS. 5B and 6.

First, in operation S221, the first deformable plate 120 and the second deformable plate 220 may be primarily deformed. For example, the first bonding chuck 100 or the first pneumatic controller 150 may inject air into the first cavity 121 provided between the first deformable plate 120 and the first base 110 to deform the first deformable plate 120 to be upward convex. Also, the second bonding chuck 200a or the second pneumatic controller 250 may inject air into the second cavity 221 provided between the second deformable plate 220 and the second base 210 to deform the second deformable plate 220 to be downward convex.

Subsequently, in operation S222, displacements of the primarily-deformed first deformable plate 120 may be sensed by using the plurality of first displacement sensors, and displacements of the primarily-deformed second deformable plate 220 may be sensed by using the plurality of second displacement sensors. The displacements at respective positions of the first deformable plate 120 on X-Y coordinates may be obtained based on the displacements of the first deformable plate 120 sensed by the plurality of first displacement sensors. Also, the displacements at respective positions of the second deformable plate 220 based on the X-Y coordinates may be obtained based on the displacements of the second deformable plate 220 sensed by the plurality of second displacement sensors.

Subsequently, whether the displacements of the first deformable plate 120 are the same as the displacements of the second deformable plate 220 may be determined in operation S223. That is, the controller 300 may perform an operation of receiving data of the displacements of the primarily-deformed first deformable plate 120 sensed by the plurality of first displacement sensors and data of the displacements of the primarily-deformed second deformable plate 220 sensed by the plurality of second displacement sensors and determining whether the displacements at respective positions of the primarily-deformed first deformable plate 120 are the same as the displacements at respective positions of the second deformable plate 220 at a corresponding position (e.g., X-Y coordinate).

When it is determined that the displacements at respective positions of the first deformable plate 120 are the same as the displacements at respective positions of the second deformable plate 220 at a corresponding position, bonding between the first substrate S1 and the second substrate S2 may be performed.

Alternatively, when it is determined that at least one of the displacements at respective positions of the first deformable plate 120 differs from the displacements at respective positions of the second deformable plate 220 at a corresponding position, an operation (S224) of locally correcting deformation of the first deformable plate 120 and/or deformation of the second deformable plate 220 may be performed subsequently. After deformation of the first deformable plate 120 and/or deformation of the second deformable plate 220 are/is locally corrected through operation S224, operation S222 and operation S223 may be performed again.

Operation S224 may sequentially perform an operation of detecting a position where it is determined that a displacement of the primarily-deformed first deformable plate 120 differs from that of the primarily-deformed second deformable plate 220, an operation of calculating the amount of deformation needed for adjusting the displacement of the first deformable plate 120 to be equal to the displacement of the second deformable plate 220 at the detected position, and an operation of locally deforming the first deformable plate 120 and/or the second deformable plate 220 at the detected position on the basis of the calculated amount of deformation.

Figure 7:
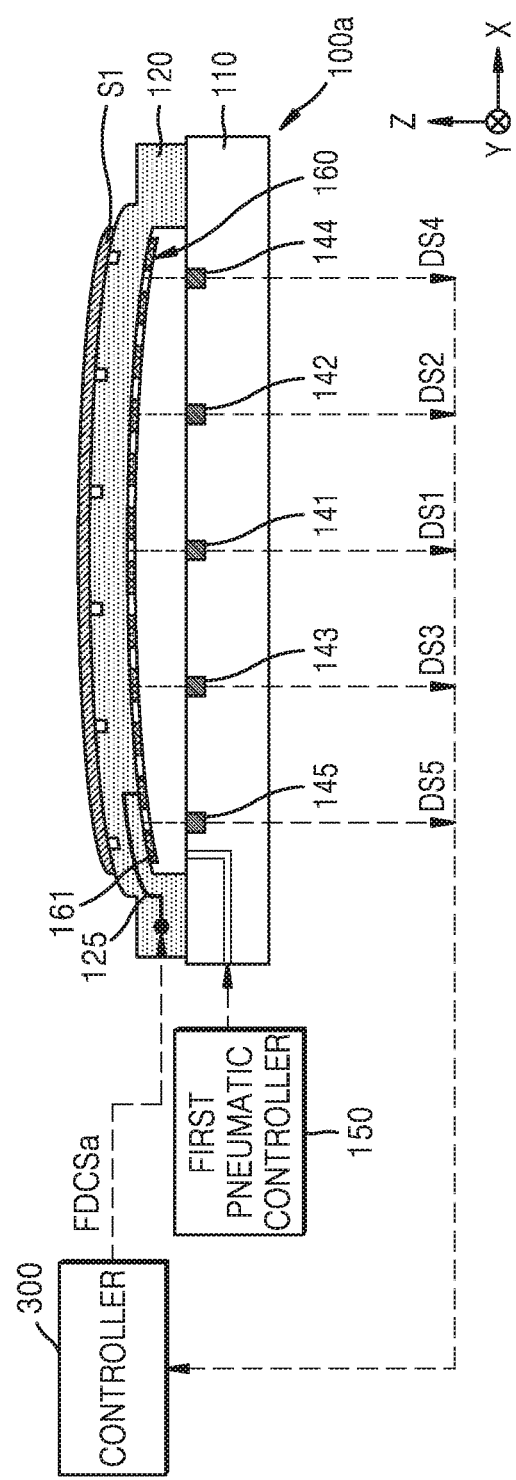
FIG. 7 is a cross-sectional view illustrating a first bonding chuck according to embodiments.

FIG. 7 is a cross-sectional view illustrating a first bonding chuck 100a according to embodiments. Except for including a first piezoelectric sheet 160, the first bonding chuck 100a illustrated in FIG. 7 may be substantially the same as or similar to the first bonding chuck 100 of the substrate bonding apparatus illustrated in FIGS. 3A to 3F. For convenience of description and in the interest of brevity, descriptions which are the same as or similar to the above descriptions may be omitted.

Referring to FIG. 7, the first bonding chuck 100a may include a first piezoelectric sheet 160 attached on or to a first deformable plate 120. The first piezoelectric sheet 160 may be disposed on the other surface opposite to one surface of the first deformable plate 120 supporting a first substrate S1. When power is applied to the first piezoelectric sheet 160, a portion, supplied with the power, of the first piezoelectric sheet 160 may be locally deformed by a piezoelectric effect. For example, the first piezoelectric sheet 160 may locally contract or expand by power applied from the outside. The local deformation of the first piezoelectric sheet 160 may cause local deformation of the first deformable plate 120.

The first piezoelectric sheet 160 may include, for example, a plurality of piezoelectric elements 161. In this case, when power is applied to some of the plurality of piezoelectric elements 161, the first deformable plate 120 may be locally deformed at or near the some piezoelectric elements 161 supplied with the power. For example, when a first power (for example, a positive (+) voltage) is applied to some of the plurality of piezoelectric elements 161 and thus a first portion of the first piezoelectric sheet 160 contracts locally, a portion of the first deformable plate 120 near the first portion of the first piezoelectric sheet 160 may be deformed to increase in curvature, and thus, a distance between a portion of the first deformable plate 120 and a first base 110 may increase. Also, when a second power (for example, a negative (−) voltage) opposite to the first power is applied to some of the plurality of piezoelectric elements 161 and thus the first portion of the first piezoelectric sheet 160 expands locally, a portion of the first deformable plate 120 near the first portion of the first piezoelectric sheet 160 may be deformed to decrease in curvature, and thus, a distance between a portion of the first deformable plate 120 and a first base 110 may decrease.

Hereinafter, a method of correcting deformation of the first deformable plate 120 by using the first bonding chuck 100a according to embodiments will be described.

First, the first bonding chuck 100a may vacuum-adsorb or vacuum hold the first substrate S1 placed on the first deformable plate 120 and may increase pressure of a first cavity 121 by using a first pneumatic controller 150 to primarily deform the first deformable plate 120 in a convex shape. Subsequently, the controller 300 may perform an operation of receiving data of displacements at respective positions of the primarily-deformed first deformable plate 120 transmitted from the plurality of first displacement sensors and determining whether the displacements at respective positions of the primarily-deformed first deformable plate 120 are within a predetermined reference range.

In this case, when it is determined that at least one of the displacements at respective positions of the first deformable plate 120 sensed by the plurality of first displacement sensors is outside the predetermined reference range, the controller 300 may perform feedback control for correcting deformation of the first deformable plate 120.

For example, the controller 300 may detect a position where a displacement of the primarily-deformed first deformable plate 120 is outside the reference range, calculate the amount of deformation needed for correcting the displacement of the first deformable plate 120 at the detected position, and apply a feedback deformation control signal FDCSa corresponding to the calculated amount of deformation to the first bonding chuck 100a. The feedback deformation control signal FDCSa may have a voltage value corresponding to the calculated amount of deformation. When the feedback deformation control signal FDCSa is applied to the first bonding chuck 100a, power applied to the first bonding chuck 100a may be applied to, through a power line 125, a piezoelectric element 161 located at the detected position. The piezoelectric element 161 supplied with the power may contract or expand to locally deform the first deformable plate 120. When the displacement of the first deformable plate 120 is adjusted to within the predetermined reference range at the detected position as a result of the local deformation of the first deformable plate 120, deformation of the first deformable plate 120 may end, and bonding between the first substrate S1 and the second substrate S2 may be performed.

The second bonding chuck 200a illustrated in FIGS. 5A to 5F may have a configuration which is substantially the same as or similar to the first bonding chuck 100a. For example, the second bonding chuck 200a may include a second piezoelectric sheet attached on the second deformable plate 220, and the controller 300 may be configured to control local deformation of the second deformable plate 220 by using the second piezoelectric sheet. A method of deforming the second deformable plate 220 by using the second piezoelectric sheet may be substantially the same as or similar to a method of deforming the first deformable plate 120 by using the first piezoelectric sheet 160 described above with reference to FIG. 7.

Figure 8A:
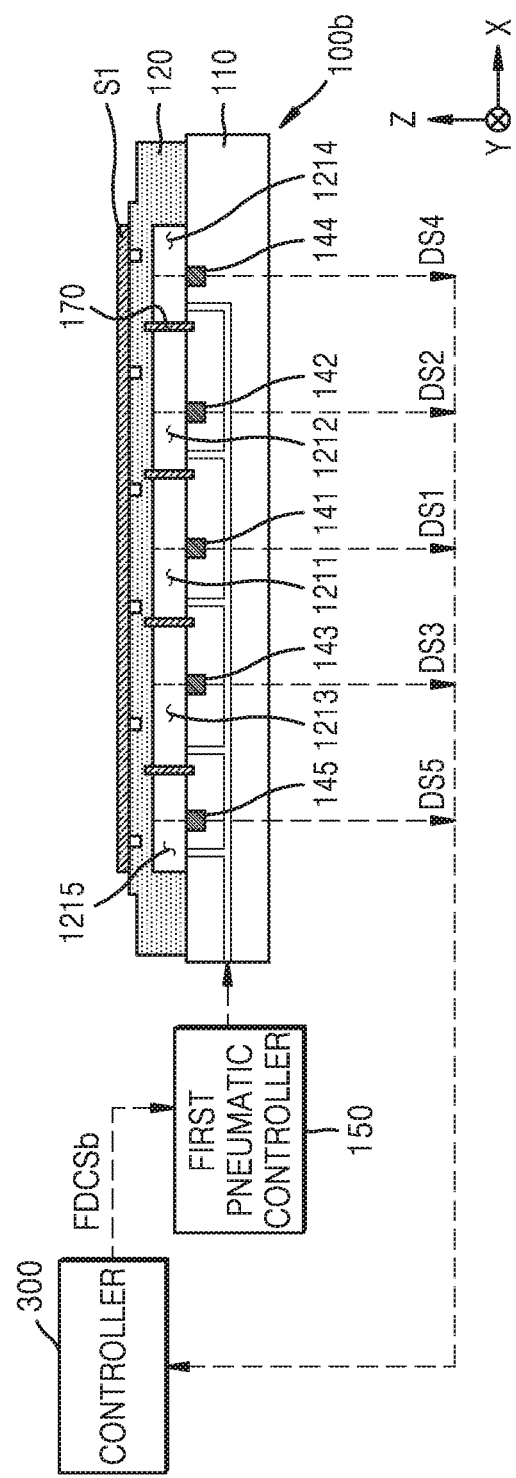
FIGS. 8A and 8B are cross-sectional views illustrating a first bonding chuck according to embodiments.
Figure 8B:
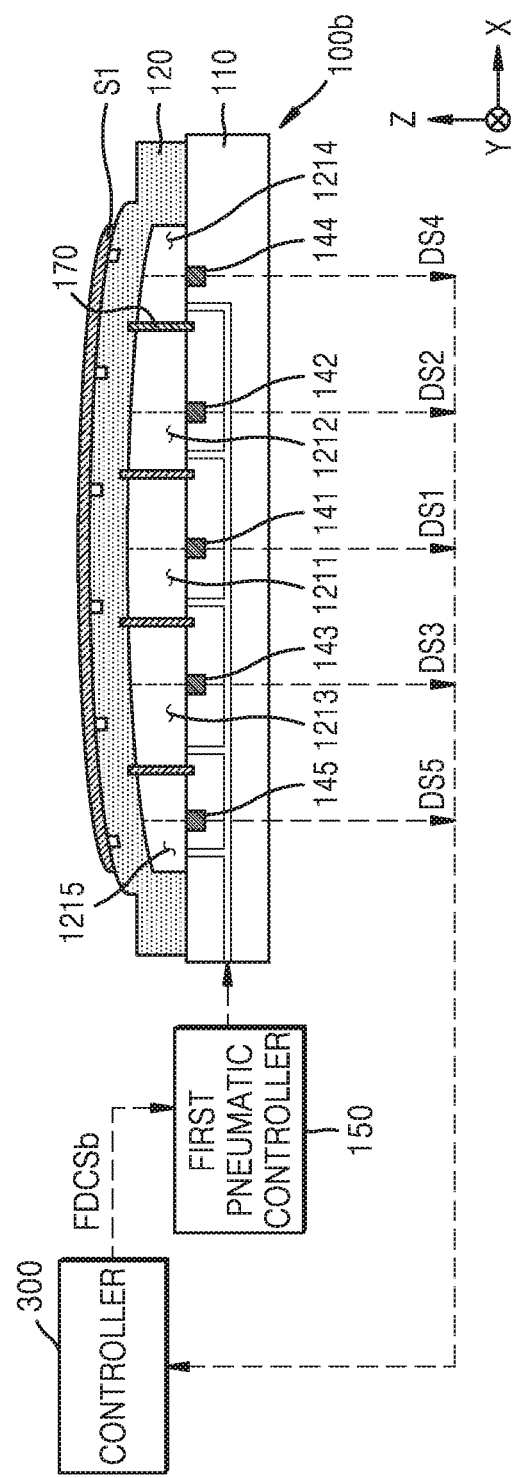

FIGS. 8A and 8B are cross-sectional views illustrating a first bonding chuck 100b according to embodiments. FIG. 8A shows a shape before a first deformable plate 120 is deformed, and FIG. 8B shows a shape of a deformed first deformable plate 120. Except for including a first partition wall 170, the first bonding chuck 100b illustrated in FIGS. 8A and 8B may be substantially the same as or similar to the first bonding chuck 100 of the substrate bonding apparatus illustrated in FIGS. 3A to 3F. For convenience of description and in the interest of brevity, descriptions which are the same as or similar to the above descriptions may be omitted.

Referring to FIGS. 8A and 8B, the first bonding chuck 100b may include a first partition wall 170 which divides a first cavity into a plurality of first sub-cavities 1211 to 1215. There may be a plurality of partition walls 170. A lower portion of the first partition wall 170 may be fixed to a first base 110, and an upper portion of the first partition wall 170 may be fixed to a first deformable plate 120. The first partition wall 170 may be configured to be shortened or elongated in a vertical direction (for example, a Z direction) according to the deformation level of the first deformable plate 120.

A first pneumatic controller 150 may be configured to individually control pressures of the plurality of first sub-cavities 1211 to 1215 divided by the first partition wall 170. The first pneumatic controller 150 may control pressures of some of the plurality of first sub-cavities 1211 to 1215 to locally deform the first deformable plate 120.

For example, when air is injected into some of the plurality of first sub-cavities 1211 to 1215 by the first pneumatic controller 150, a portion of the first deformable plate 120 near the some sub-cavities with air injected thereinto may be deformed to increase in curvature, and thus, a distance between the portion of the first deformable plate 120 and the first base 110 may increase. Also, when air is exhausted from some of the plurality of first sub-cavities 1211 to 1215 by the first pneumatic controller 150, a portion of the first deformable plate 120 near the some sub-cavities from which air is exhausted may be deformed to decrease in curvature, and thus, a distance between the portion of the first deformable plate 120 and the first base 110 may decrease.

Hereinafter, a method of correcting deformation of the first deformable plate 120 according to embodiments will be described.

First, the first bonding chuck 100b may vacuum-adsorb or vacuum hold the first substrate S1 placed on the first deformable plate 120, and the first pneumatic controller 150 may primarily deform the first deformable plate 120 in a convex shape. Subsequently, the controller 300 may perform an operation of receiving data of displacements at respective positions of the primarily-deformed first deformable plate 120 transmitted from the plurality of first displacement sensors and determining whether each of the displacements at respective positions of the primarily-deformed first deformable plate 120 is within a predetermined reference range. In this case, when it is determined that at least one of the displacements at respective positions of the first deformable plate 120 sensed by the plurality of first displacement sensors is outside the predetermined reference range, the controller 300 may perform feedback control for correcting deformation of the first deformable plate 120.

The controller 300 may detect a position where a displacement of the primarily-deformed first deformable plate 120 is outside the reference range, calculate the amount of deformation needed for correcting the displacement of the first deformable plate 120 at the detected position, and apply a feedback deformation control signal FDCSb corresponding to the calculated amount of deformation to the first pneumatic controller 150. The controller 300 or the first pneumatic controller 150 may control pressure of a sub-cavity corresponding to the detected position on the basis of the feedback deformation control signal FDCSb to locally deform the first deformable plate 120. When the displacement of the first deformable plate 120 is adjusted to within the predetermined reference range at the detected position as a result of the local deformation of the first deformable plate 120, deformation of the first deformable plate 120 may end, and bonding between the first substrate S1 and the second substrate S2 may be performed.

The second bonding chuck 200a illustrated in FIGS. 5A to 5F may have a configuration which is substantially the same as or similar to the first bonding chuck 100b. For example, the second bonding chuck 200a may include a second partition wall which divides a second cavity 221 into a plurality of second sub-cavities, and by using a second pneumatic controller, the controller 300 may individually control pressures of the plurality of second sub-cavities to control local deformation of the second deformable plate 220. In this case, a method of deforming the second deformable plate 220 by using the second pneumatic controller may be substantially the same as or similar to a method of deforming the first deformable plate 120 by using the first pneumatic controller 150 described above with reference to FIGS. 8A and 8B.

Figure 9:
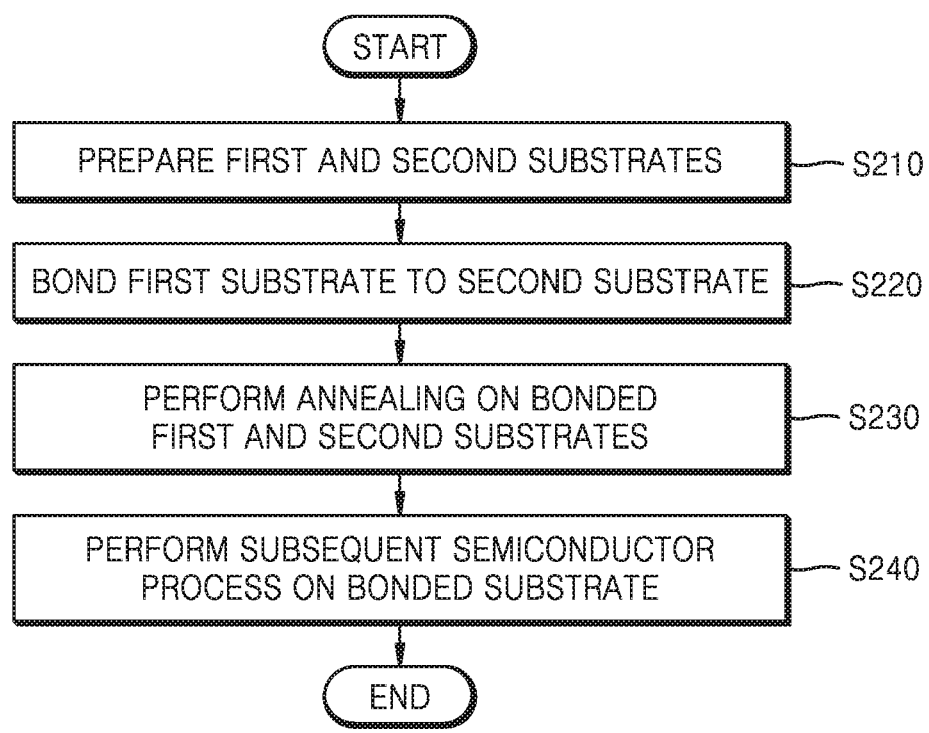
FIG. 9 is a flowchart illustrating a method of manufacturing a semiconductor device, according to embodiments.
Figure 10A:
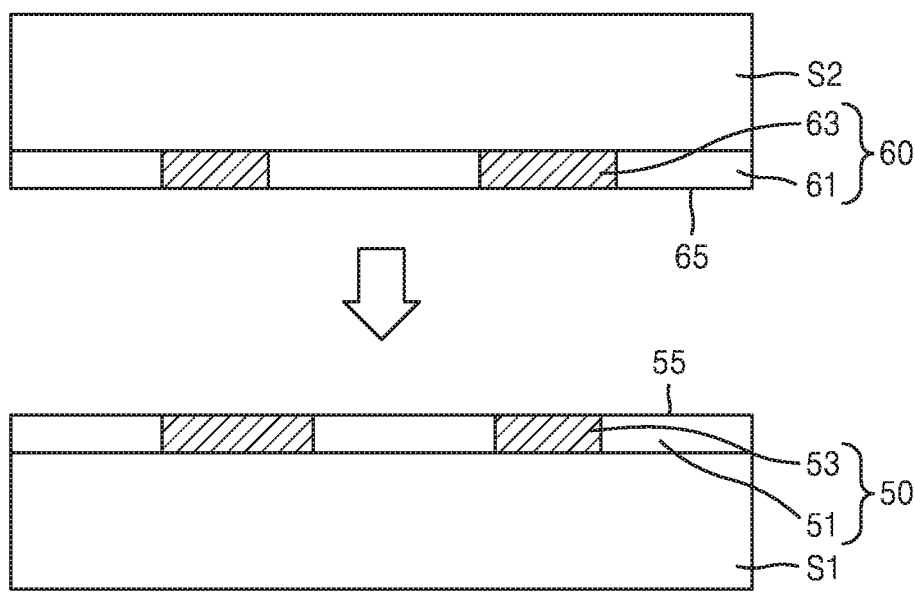
FIGS. 10A and 10B are cross-sectional views illustrating a process of bonding a first substrate to a second substrate in sequence.
Figure 10B:
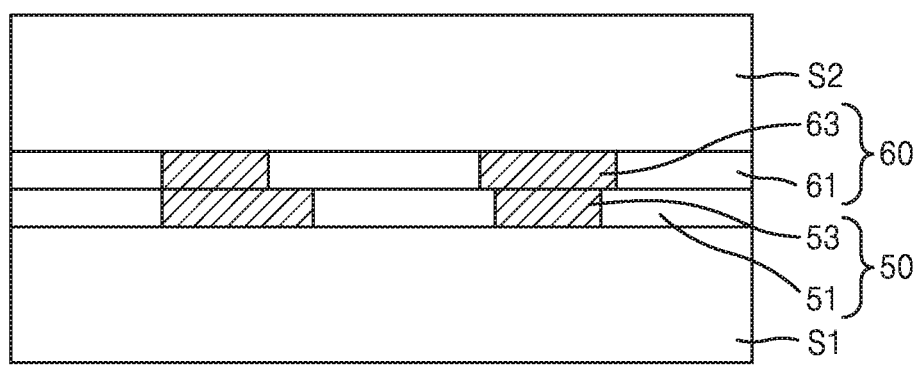

FIG. 9 is a flowchart illustrating a method of manufacturing a semiconductor device, according to embodiments. FIGS. 10A and 10B are cross-sectional views illustrating a process of bonding a first substrate S1 to a second substrate S2 in sequence. Hereinafter, a method of manufacturing a semiconductor device according to embodiments will be described with reference to FIGS. 9, 10A, and 10B.

Referring to FIGS. 9 and 10A, the first substrate S1 and the second substrate S2 which are to be bonded may be prepared in operation S210.

Each of the first and second substrates S1 and S2 may include an active surface, on which a semiconductor structure is provided, and an inactive surface opposite to the active surface. The active surface may correspond to a front surface of each of the first and second substrates S1 and S2, and the inactive surface may correspond to a back or backside surface of each of the first and second substrates S1 and S2. In embodiments, the first substrate S1 may include a first semiconductor structure 50 provided on the active surface thereof, and the second substrate S2 may include a second semiconductor structure 60 provided on the active surface thereof.

Each of the first and second substrates S1 and S2 may be, for example, a single crystalline substrate or a silicon wafer. Alternatively, each of the first and second substrates S1 and S2 may include a semiconductor element such as germanium, or may include a compound semiconductor such as silicon carbide (SiC), gallium arsenide (GaAs), indium arsenide (InAs), or indium phosphide (InP).

The first semiconductor structure 50 may include a first insulation layer 51 and a first conductive pattern 53, and the second semiconductor structure 60 may include a second insulation layer 61 and a second conductive pattern 63. Each of the first and second insulation layers 51 and 61 may include, for example, silicon oxide. Each of the first and second conductive patterns 53 and 63 may include, for example, copper (Cu). Also, in embodiments, each of the first and second semiconductor structures 50 and 60 may include a semiconductor device layer configuring a plurality of individual devices and a wiring structure layer for electrically connecting the plurality of individual devices.

The plurality of individual devices may be a volatile memory and/or a non-volatile memory. The volatile memory may be, for example, dynamic RAM (DRAM) or static RAM (SRAM), and the non-volatile memory may be, for example, flash memory, magnetic RAM (MRAM), or phase change RAM (PRAM). Alternatively, a logic chip, a system-on chip (SoC), an application specific integrated circuit (ASIC), or an image sensor chip may be provided in each of the first and second substrates S1 and S2. The wiring structure layer may include a metal wiring layer and/or a via plug. The wiring structure layer may be, for example, a multi-layer structure where two or more metal wiring layers and/or two or more via plugs are alternately stacked.

In embodiments, the first substrate S1 may be a wafer including a logic chip, and the second substrate S2 may be a wafer including a memory chip. Alternatively, the first substrate S1 may be a wafer including a logic chip, and the second substrate S2 may be a wafer including an image sensor chip.

Referring to FIGS. 9 and 10B, the first substrate S1 may be bonded to the second substrate S2 in operation S220. A first bonding chuck (see, e.g., 100 of FIG. 1) and a second bonding chuck (see, e.g., 200 of FIG. 1) may perform align bonding to bond the first substrate S1 to the second substrate S2. When the first substrate S1 is bonded to the second substrate S2, a surface (55 of FIG. 10A) of the first semiconductor structure 50 may contact a surface (65 of FIG. 10A) of the second semiconductor structure 60, and the first conductive pattern 53 of the first semiconductor structure 50 may contact the second conductive pattern 63 of the second semiconductor structure 60.

Referring to FIG. 9, when bonding between the first substrate S1 and the second substrate S2 is completed by using the substrate bonding apparatus (see, e.g., 10 of FIG. 1), annealing may be performed on the bonded first and second substrates S1 and S2 so that an increase in bonding strength between the first substrate S1 and the second substrate S2 is performed in operation S230. Based on the annealing, the first conductive pattern 53 of the first semiconductor structure 50 may be more solidly bonded to the second conductive pattern 63 of the second semiconductor structure 60, and the first conductive pattern 53 of the first semiconductor structure 50 may be more solidly bonded to the second conductive pattern 63 of the second semiconductor structure 60.

Referring to FIG. 9, a subsequent semiconductor process may be performed on a bonded substrate 70 including the bonded first and second substrates S1 and S2 in operation S240. The subsequent semiconductor process may include various processes. For example, the subsequent semiconductor process may include a deposition process, an etch process, an ion process, and a cleaning process. Here, the deposition process may include various material layer forming processes such as a chemical vapor deposition (CVD) process, a sputtering process, and a spin coating process. The ion process may include processes such as ion injection, diffusion, and thermal treatment. Integrated circuits and wirings configuring a semiconductor device may be formed by performing the subsequent semiconductor process. Also, the subsequent semiconductor process may perform a packaging process of mounting the semiconductor device on a printed circuit board and forming a molding layer. Also, the subsequent semiconductor process may include a test process of testing the semiconductor device or a semiconductor package. The semiconductor device or the semiconductor package may be finished by performing the subsequent semiconductor process.

While the inventive concept has been particularly shown and described with reference to embodiments thereof, it will be understood that various changes in form and details may be made therein without departing from the spirit and scope of the following claims.

What is claimed is:

1. A substrate bonding apparatus comprising:
   a first bonding chuck configured to support a first substrate, the first bonding chuck comprising:
   a first base;
   a first deformable plate on the first base and configured to support the first substrate, the first deformable plate configured to be deformed such that a distance between the first base and the first deformable plate is varied; and
   a first piezoelectric sheet on the first deformable plate and configured to be deformed in response to power applied thereto to deform the first deformable plate; and
   a second bonding chuck configured to support a second substrate such that the second substrate faces the first substrate.

2. The substrate bonding apparatus of claim 1, wherein the first bonding chuck further comprises a plurality of first displacement sensors configured to sense displacements of different portions of the first deformable plate, and
   the substrate bonding apparatus further comprises a controller configured to control deformation of the first piezoelectric sheet on the basis of the displacements sensed by the plurality of first displacement sensors.

3. The substrate bonding apparatus of claim 2, wherein the first bonding chuck is configured to primarily deform the first deformable plate to a convex shape relative to the second bonding chuck,
   the controller is configured to generate a feedback deformation control signal for deforming the first piezoelectric sheet on the basis of displacements of the primarily-deformed first deformable plate sensed by the plurality of first displacement sensors, and
   the first piezoelectric sheet is configured to be deformed based on the feedback deformation control signal to secondarily deform the first deformable plate.

4. The substrate bonding apparatus of claim 3, wherein the first bonding chuck is configured to control pressure in a first cavity between the first base and the first deformable plate to primarily deform the first deformable plate.

5. The substrate bonding apparatus of claim 2, wherein the plurality of first displacement sensors are on the first base.

6. The substrate bonding apparatus of claim 1, wherein when a first portion of the first piezoelectric sheet contracts, a portion of the first deformable plate on the first portion of the first piezoelectric sheet is deformed to increase in curvature.

7. The substrate bonding apparatus of claim 1, wherein when a first portion of the first piezoelectric sheet expands, a portion of the first deformable plate on the first portion of the first piezoelectric sheet is deformed to decrease in curvature.

8. The substrate bonding apparatus of claim 1, wherein the first bonding chuck further comprises a plurality of first displacement sensors configured to respectively sense displacements of different portions of the first deformable plate, and the substrate bonding apparatus further comprises:
a chuck actuator configured to move at least one of the first bonding chuck and the second bonding chuck; and
a controller configured to, while a bonding region between the first substrate and the second substrate is propagating, generate a feedback position control signal for controlling a distance between the first bonding chuck and the second bonding chuck on the basis of the displacements sensed by the plurality of first displacement sensors and apply the feedback position control signal to the chuck actuator.

9. The substrate bonding apparatus of claim 1, wherein the second bonding chuck further comprises:
a second base;
a second deformable plate on the second base and configured to support the second substrate, the second deformable plate configured to be deformed such that a distance between the second base and the second deformable plate is varied; and
a second piezoelectric sheet on the second deformable plate and configured to be deformed in response to power applied thereto to deform the second deformable plate.

10. The substrate bonding apparatus of claim 9, wherein the first bonding chuck further comprises a plurality of first displacement sensors configured to sense displacements of different portions of the first deformable plate,
the second bonding chuck further comprises a plurality of second displacement sensors configured to sense displacements of different portions of the second deformable plate, and
the substrate bonding apparatus further comprises a controller configured to control deformation of the first piezoelectric sheet on the basis of the displacements sensed by the plurality of first displacement sensors and to control deformation of the second piezoelectric sheet on the basis of the displacements sensed by the plurality of second displacement sensors.

11. The substrate bonding apparatus of claim 10, wherein the first bonding chuck is configured to primarily deform the first deformable plate to a convex shape relative to the second bonding chuck,
the second bonding chuck is configured to primarily deform the second deformable plate to convex shape relative to the first bonding chuck,
the controller is configured to generate a feedback deformation control signal for deforming the first piezoelectric sheet on the basis of displacements of the primarily-deformed first deformable plate sensed by the plurality of first displacement sensors and for deforming the second piezoelectric sheet on the basis of displacements of the primarily-deformed second deformable plate sensed by the plurality of second displacement sensors,
the first piezoelectric sheet is configured to be deformed based on the feedback deformation control signal to secondarily deform the first deformable plate, and
the second piezoelectric sheet is configured to be deformed based on the feedback deformation control signal to secondarily deform the second deformable plate.

12. The substrate bonding apparatus of claim 11, wherein the first bonding chuck is configured to control pressure in a first cavity between the first base and the first deformable plate to primarily deform the first deformable plate, and
the second bonding chuck is configured to control pressure in a second cavity between the second base and the second deformable plate to primarily deform the second deformable plate.

13. The substrate bonding apparatus of claim 1, wherein the first bonding chuck further comprises a partition wall that divides a first cavity between the first base and the first deformable plate into a plurality of sub-cavities, and
the first bonding chuck is configured to individually control pressure in each of the plurality of sub-cavities.

14. A substrate bonding apparatus comprising:
a first bonding chuck comprising:
a first base;
a first deformable plate mounted on the first base, the first deformable plate configured to deform a first substrate while supporting the first substrate; and
a plurality of first displacement sensors configured to sense displacements of different portions of the first deformable plate and distances between the different portions of the first deformable plate and the first base;
a second bonding chuck configured to support a second substrate such that the second substrate faces the first substrate; and
a controller configured to control deformation of the first deformable plate,
wherein the first bonding chuck is configured to primarily deform the first deformable plate to have a convex shape relative to the second bonding chuck,
the controller is configured to generate a feedback deformation control signal for secondarily deforming the first deformable plate on the basis of displacements of the primarily-deformed first deformable plate sensed by the plurality of first displacement sensors,
the first bonding chuck further comprises a first piezoelectric sheet on a surface of the first deformable plate, the first piezoelectric sheet comprising a plurality of piezoelectric elements, and
the first bonding chuck is configured to apply power to at least some of the plurality of piezoelectric elements according to the feedback deformation control signal to deform the at least some piezoelectric elements.

15. The substrate bonding apparatus of claim 14, wherein the first bonding chuck further comprises:
a partition wall that divides a first cavity between the first deformable plate and the first base into a plurality of sub-cavities; and
a first pneumatic controller configured to individually control pressure in each of the plurality of sub-cavities according to the feedback deformation control signal, wherein a lower portion of the partition wall is fixed to the first base, an upper portion of the partition wall is fixed to the first deformable plate, and the partition wall is configured to be shortened or elongated according to the deformation of the first deformable plate.

16. The substrate bonding apparatus of claim 14, wherein the second bonding chuck further comprises a pressurization pin configured to push a center of the second substrate toward the first substrate, and the pressurization pin is configured to, when the secondary deformation of the first deformable plate is completed, push the center of the second substrate to cause the first substrate to contact the second substrate.

17. The substrate bonding apparatus of claim 14, wherein the first bonding chuck further comprises a vacuum pump configured to progressively release vacuum adherence of the first substrate in a direction from a center of the first substrate to an outer region of the first substrate to allow spontaneous propagation of bonding between the first substrate and the second substrate.

18. The substrate bonding apparatus of claim 17, further comprising a chuck actuator configured to move at least one of the first bonding chuck and the second bonding chuck, wherein the controller is configured to, while bonding between the first substrate and the second substrate is propagating, generate a feedback position control signal for controlling a distance between the first bonding chuck and the second bonding chuck on the basis of a displacement of a center of the first deformable plate and apply the feedback position control signal to the chuck actuator.

19. A substrate bonding apparatus comprising:

a first bonding chuck comprising:

a first base;

a first deformable plate mounted on the first base, the first deformable plate configured to deform a first substrate while supporting the first substrate; and a plurality of first displacement sensors configured to sense displacements of different portions of the first deformable plate and distances between the different portions of the first deformable plate and the first base;

a second bonding chuck comprising a second deformable plate configured to deform a second substrate while supporting the second substrate and a plurality of second displacement sensors configured to sense displacements of different portions of the second deformable plate, the second bonding chuck above the first bonding chuck; and a controller configured to control deformation of the first deformable plate and deformation of the second deformable plate, wherein the first bonding chuck is configured to primarily deform the first deformable plate to an upward convex shape, the second bonding chuck is configured to primarily deform the second deformable plate to a downward convex shape, the controller is configured to generate a feedback deformation control signal for secondarily deforming each of the first deformable plate and the second deformable plate on the basis of displacements of the primarily-deformed first deformable plate sensed by the plurality of first displacement sensors and displacements of the primarily-deformed second deformable plate sensed by the plurality of second displacement sensors, the first bonding chuck further comprises a first piezoelectric sheet on a surface of the first deformable plate, the first piezoelectric sheet comprising a plurality of piezoelectric elements, and the first bonding chuck is configured to apply power to at least some of the plurality of piezoelectric elements according to the feedback deformation control signal to deform the at least some piezoelectric elements.

* * * * *